(12) United States Patent
Lee

(10) Patent No.: US 12,243,876 B2
(45) Date of Patent: Mar. 4, 2025

(54) DISPLAY DEVICE AND TILED DISPLAY DEVICE INCLUDING THE SAME

(71) Applicant: Samsung Display Co., LTD., Yongin-si (KR)

(72) Inventor: Doo Hyun Lee, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 451 days.

(21) Appl. No.: 17/544,159

(22) Filed: Dec. 7, 2021

(65) Prior Publication Data

US 2022/0293636 A1 Sep. 15, 2022

(30) Foreign Application Priority Data

Mar. 15, 2021 (KR) .................. 10-2021-0033508

(51) Int. Cl.
*H01L 27/12* (2006.01)
*H01L 25/16* (2023.01)
*H01L 23/00* (2006.01)

(52) U.S. Cl.
CPC .......... *H01L 27/124* (2013.01); *H01L 25/162* (2013.01); *H01L 25/167* (2013.01); *H01L 27/1218* (2013.01); *H01L 24/32* (2013.01); *H01L 2224/32137* (2013.01)

(58) Field of Classification Search
CPC .............. H01L 27/1218; H01L 27/124; H01L 25/167
See application file for complete search history.

(56) References Cited

U.S. PATENT DOCUMENTS

| 10,256,221 | B2 | 4/2019 | Bibl et al. | |
|---|---|---|---|---|
| 2016/0124259 | A1* | 5/2016 | Kawata | H01L 27/1218 257/72 |
| 2020/0312886 | A1 | 10/2020 | Yuan et al. | |
| 2020/0381410 | A1* | 12/2020 | Yueh | H01L 25/167 |
| 2022/0004281 | A1 | 1/2022 | Hyun et al. | |
| 2022/0140046 | A1 | 5/2022 | Zhou et al. | |

FOREIGN PATENT DOCUMENTS

| CN | 111584562 | 8/2020 |
|---|---|---|
| CN | 111724742 | 9/2020 |
| JP | 2018-81197 | 5/2018 |
| KR | 10-2016-0038959 | 4/2016 |
| KR | 10-2019-0048642 | 5/2019 |
| KR | 10-2022-0004895 | 1/2022 |

OTHER PUBLICATIONS

Extended European Search Report for European Application No./Patent No. 22162318.4, dated Aug. 12, 2022.

* cited by examiner

*Primary Examiner* — Peter M Albrecht
(74) *Attorney, Agent, or Firm* — KILE PARK REED & HOUTTEMAN PLLC

(57) ABSTRACT

A display device includes a first substrate including a display area and a non-display area adjacent to the display area, a first voltage line disposed on the first substrate and supplying a first voltage, a second substrate disposed on the first voltage line, and a thin film transistor layer disposed on the second substrate and comprising a plurality of thin film transistors and a second voltage line disposed in the non-display area and electrically connected to the first voltage line through a first contact hole penetrating the second substrate.

19 Claims, 16 Drawing Sheets

LA: LA1, LA2, LA3

LA: LA1, LA2, LA3

DISPLAY DEVICE AND TILED DISPLAY DEVICE INCLUDING THE SAME

CROSS-REFERENCE TO RELATED APPLICATION(S)

This application claims priority to and the benefit of Korean Patent Application No. 10-2021-0033508 under 35 U.S.C. § 119, filed on Mar. 15, 2021, in the Korean Intellectual Property Office (KIPO), the entire contents of which are incorporated herein by reference.

BACKGROUND

1. Technical Field

The disclosure relates to a display device and a tiled display device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image can be displayed without a backlight unit providing light to the display panel.

In case that the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting display devices having a relatively small size. The tiled display device may include a boundary portion called a seam between the display devices, due to a non-display area or a bezel area of each of the display devices adjacent to each other. When a single image is displayed on the entire screen, the boundary portion between the display devices gives a sense of disconnection over the entire screen, thereby reducing a sense of immersion in the image.

SUMMARY

Aspects of the disclosure also provide a tiled display device capable of removing a sense of disconnection between a plurality of display devices and improving a sense of immersion in an image, by preventing the recognition of boundary portions or non-display areas between the plurality of display devices.

Aspects of the disclosure also provide a display device and a tiled display device including the same, capable of minimizing a non-display area by reducing a width of a voltage line disposed in the non-display area of a thin film transistor layer.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may comprise a first substrate including a display area and a non-display area adjacent to the display area, a first voltage line disposed on the first substrate and supplying a first voltage, a second substrate disposed on the first voltage line, and a thin film transistor layer disposed on the second substrate and comprising a plurality of thin film transistors, and a second voltage line disposed in the non-display area and electrically connected to the first voltage line through a first contact hole penetrating the second substrate.

The first voltage line may be disposed on a plurality of edges of the first substrate, and the second voltage line may be disposed on a plurality of edges of the thin film transistor layer.

The first and second voltage lines may have a same width in a plan view.

A width of the first voltage line in a plan view may be greater than a width of the second voltage line in a plan view.

The first voltage line may be disposed on an edge of the display area and in the non-display area.

The first voltage line may include a first portion disposed in the non-display area, a second portion extending from the first portion and traversing the display area, and a third portion protruding from the second portion disposed in the display area.

The first voltage line may include a first portion disposed in the non-display area, and a second portion disposed in the display area, extending in a first direction and a second direction intersecting the first direction, and having have a grid shape.

The display area may include a plurality of emission areas emitting light and a light blocking area surrounding each of the plurality of emission areas. A second portion of the first voltage line may overlap the light blocking area in a thickness direction of the display device.

The display device may further comprise a first connection line disposed in the display area, the first connection line and the first voltage line being disposed in a same layer, and a second connection line disposed in the display area, the second connection line being electrically connected to the first connection line through a second contact hole penetrating the thin film transistor layer and the second substrate, and the second connection line and the second voltage line being disposed in a same layer.

The first connection line may be disposed on an edge of the display area, and the first voltage line may be disposed in the non-display area adjacent to a plurality of edges except for an edge of the display area.

The second connection line may be electrically connected to the plurality of thin film transistors and supply a data voltage to the plurality of thin film transistors.

The display device may further comprise a pad part under the first substrate and electrically connected to the first connection line through a third contact hole penetrating the first substrate, a flexible film under the first substrate and electrically connected to the pad part, and a data driver on the flexible film to supply a data voltage to the first connection line.

The display device may further comprise a light emitting element layer disposed on the thin film transistor layer and including a plurality of light emitting elements electrically connected between the plurality of thin film transistors and the second voltage line.

The thin film transistor layer may comprise a gate insulating layer disposed on the second substrate, an interlayer insulating layer disposed on the gate insulating layer, and a connection electrode disposed on the interlayer insulating layer and electrically connecting the plurality of light emitting elements and the plurality of thin film transistors. The second connection line and the connection electrode disposed on the interlayer insulating layer may include a same material.

According to an embodiment of the disclosure, a tiled display device may comprise a plurality of display devices including a display area including a plurality of pixels and a non-display area adjacent to the display area, and a bonding member bonding the plurality of display devices. Each of the plurality of display devices comprises a first substrate, a first voltage line disposed on the first substrate and supplying a first voltage, a second substrate disposed on the first voltage line, and a thin film transistor layer disposed on the second substrate and comprising a plurality of thin film transistors, and a second voltage line disposed in the non-display area and electrically connected to the first voltage line through a first contact hole penetrating the second substrate.

The first and second voltage lines may have a same width in a plan view.

A width of the first voltage line in a plan view may be greater than a width of the second voltage line in a plan view.

The first voltage line may include a first portion disposed in the non-display area, a second portion extending from the first portion and traversing the display area, and a third portion protruding from the second portion disposed in the display area.

The first voltage line may include a first portion disposed in the non-display area, and a second portion disposed in the display area, extending in a first direction and a second direction intersecting the first direction, and having a grid shape.

The display area may include a plurality of emission areas emitting light, and a light blocking area surrounding each of the plurality of emission areas, and a second portion of the first voltage line overlaps the light blocking area in a thickness direction of the tiled display device.

In the display device and the tiled display device including the same according to embodiments, a first voltage line disposed on a substrate and a second voltage line disposed on a thin film transistor layer are included, thereby relatively reducing the width of the second voltage line in a plan view, and reducing the resistance of the first and second voltage lines. Accordingly, the display device and the tiled display device including the same may minimize the area of the non-display area in which the second voltage line is disposed, and may supply a stable first voltage to second electrodes of a plurality of light emitting elements.

In the display device and the tiled display device including the same according to embodiments, a connection line and a pad part are connected at the bottom surface of a substrate through a contact hole penetrating the substrate, thereby minimizing the area of the non-display area of the display device. Accordingly, in the tiled display device, by minimizing the gap between the plurality of display devices, it is possible to prevent a user from recognizing the boundary portions or the non-display areas between the plurality of display devices.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
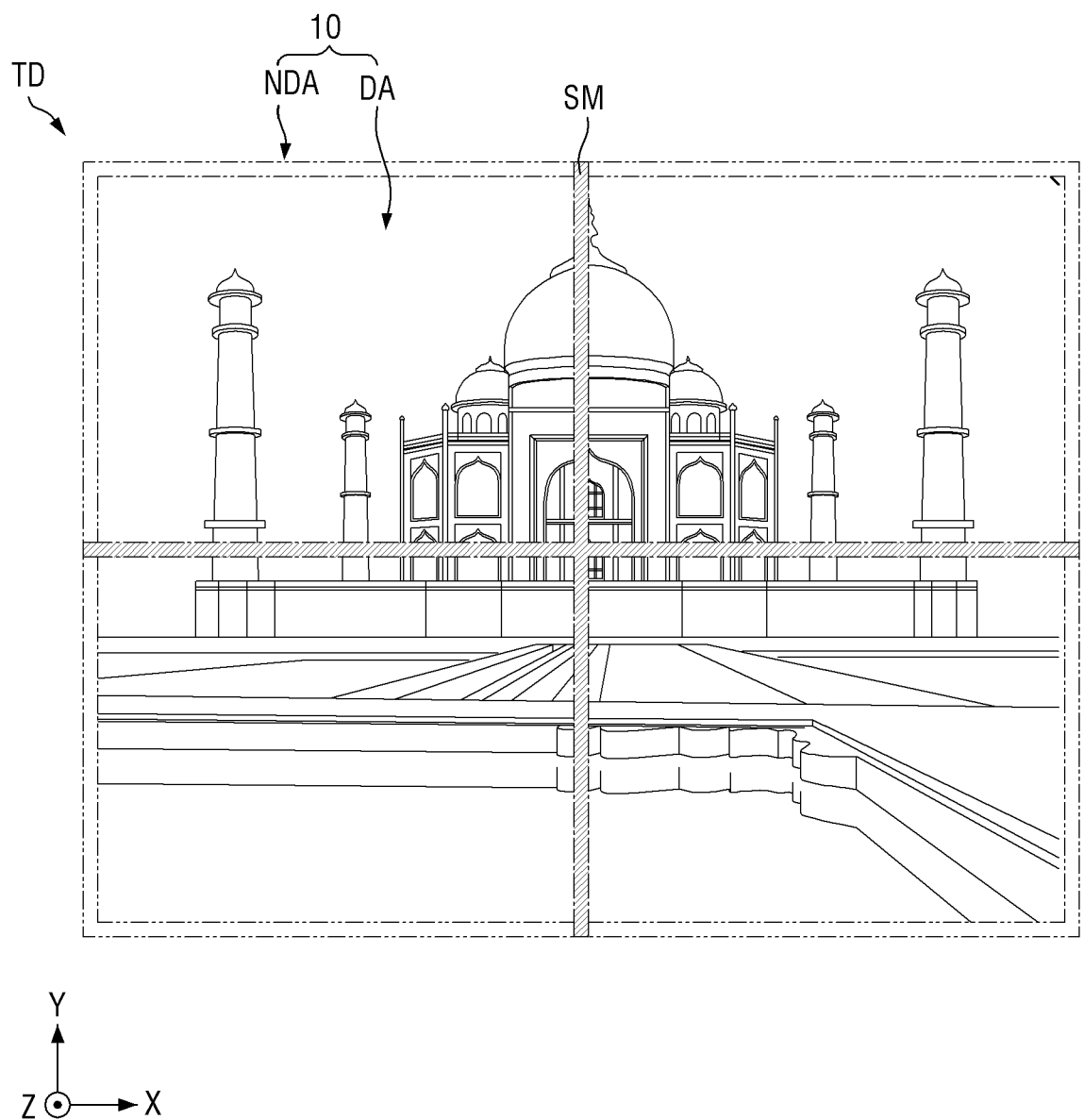
FIG. 1 is a schematic plan view illustrating a tiled display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural meanings as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, part, units, and/or modules. Those skilled in the art will appreciate that these blocks, parts, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, part, units, and/or modules being implemented by microprocessors or other similar hardware, they may be programmed and controlled using software (for example, microcode) to perform various functions discussed herein and may optionally be driven by firmware and/or software. It is also contemplated that each block, part, unit, and/or module may be implemented by dedicated hardware, or as a combination of dedicated hardware to perform some or a number of functions and a processor (for example, one or more programmed microprocessors and associated circuitry) to perform other functions. Also, each block, part, unit, and/or module of some or a number of embodiments may be physically separated into two or more interacting and discrete blocks, parts, units, and/or modules without departing from the scope of the disclosure. Further, the blocks, parts, units, and/or modules of some or a number of embodiments may be physically combined into more complex blocks, parts, units, and/or modules without departing from the scope of the disclosure.

It will be understood that the terms "contact," "connected to," and "coupled to" may include a physical and/or electrical contact, connection or coupling.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense, unless clearly so defined herein.

FIG. 1 is a schematic plan view illustrating a tiled display device according to an embodiment.

Referring to FIG. 1, a tiled display device TD may include display devices 10. The display devices 10 may be arranged in a grid form, but the disclosure is not limited thereto. The display devices 10 may be connected in a first direction (e.g., X-axis direction) or a second direction (e.g., Y-axis direction), and the tiled display device TD may have a particular shape. For example, the display devices 10 may have the same size, but the disclosure is not limited thereto. For another example, the display devices 10 may have different sizes.

Each of the display devices 10 may have a rectangular shape including long sides and short sides. The display devices 10 may be arranged such that the long sides or the short sides thereof are connected to each other. Some (or a part) of the display devices 10 may be disposed at the edge of the tiled display device TD to form a side of the tiled display device TD. Some others (or another part) of the display devices 10 may be disposed at corners of the tiled display device TD to form two adjacent sides of the tiled display device TD. Yet some others (or another part) of the display devices 10 may be disposed on the inside of the tiled display device TD and may be surrounded by other display devices 10.

Each of the display devices 10 may include a display area DA and a non-display area NDA. The display area DA may include pixels to display an image. Each of the pixels may include an organic light-emitting diode (LED) including an organic light emitting layer, a micro LED, a quantum dot LED including a quantum dot light emitting layer, or an inorganic light emitting element including an inorganic semiconductor. The following description is directed to the case where each of the pixels includes an inorganic light emitting element, but the disclosure is not limited thereto. The non-display area NDA may be disposed around the display area DA to surround the display area DA and may not display an image.

The tiled display device TD may have a planar shape as a whole, but the disclosure is not limited thereto. The tiled display device TD may have a three-dimensional shape to provide a three-dimensional effect to a user. For example, in case that the tiled display device TD has a three-dimensional shape, at least some of the display devices 10 may have a curved shape. For another example, the display devices 10 may each have a planar shape and may be connected to each other at a predetermined angle, so that the tiled display device TD may have a three-dimensional shape.

The tiled display device TD may include a coupling area SM disposed between display areas DA. The tiled display device TD may be formed by connecting non-display areas NDA of the adjacent display devices 10. The display devices 10 may be connected to each other through a bonding member or an adhesive member disposed in the coupling area SM. The coupling area SM of each of the display devices 10 may not include a pad unit (or pad part) and a flexible film attached to the pad part. Accordingly, the distance between the display areas DA of the display devices 10 may be small enough that the coupling area SM between the display devices 10 is not recognized by the user. In addition, the reflectance of external light of the display areas DA of the display devices 10 may be substantially equal to that of the coupling area SM between the display devices 10. Accordingly, in the tiled display device TD, the coupling area SM between the display devices 10 may be prevented from being recognized by the user, thereby reducing a sense of disconnection between the display devices 10 and improving a sense of immersion in an image.

Figure 2:
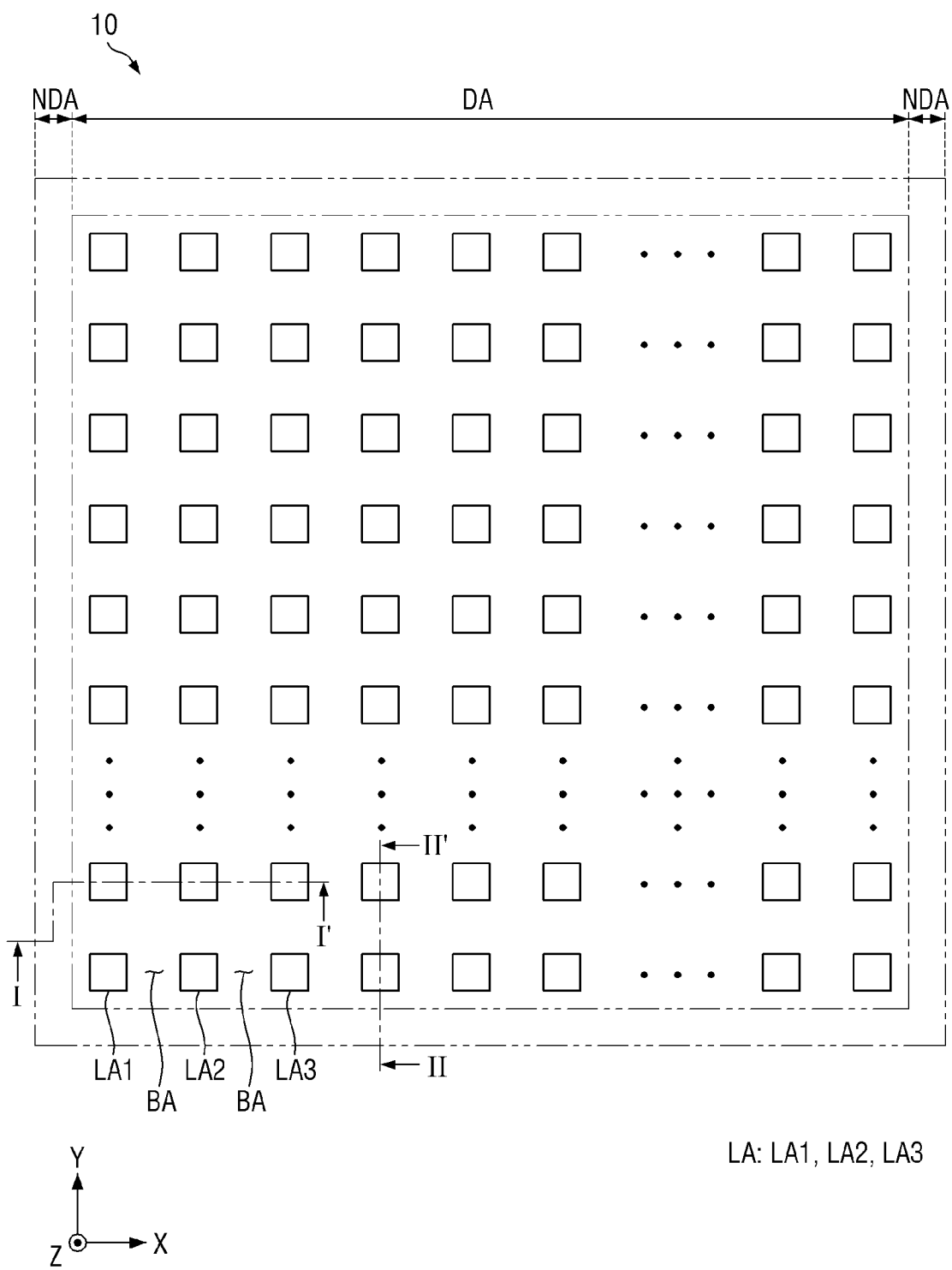
FIG. 2 is a schematic plan view illustrating a display device according to an embodiment.

FIG. 2 is a schematic plan view illustrating a display device according to an embodiment.

Referring to FIG. 2, the display device 10 may include pixels arranged in rows and columns in the display area DA. Each of the pixels may include an emission area LA defined by a pixel defining layer or bank and may emit light having a predetermined peak wavelength through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may emit light having a predetermined peak wavelength to the outside of the display device 10. The first emission area LA1 may emit light of a first color, the second emission area LA2 may emit light of a second color, and the third emission area LA3 may emit light of a third color. For example, the first color light may be red light having a peak wavelength in a range from about 610 nm to about 650 nm, the second color light may be green light having a peak wavelength in a range from about 510 nm to about 550 nm, and the third color light may be blue light having a peak wavelength in a range from about 440 nm to about 480 nm, but the disclosure is not limited thereto.

The first to third emission areas LA1, LA2, and LA3 may be sequentially arranged repetitively in the first direction (e.g., X-axis direction) in the display area DA. For example, the first emission area LA1 may be larger in size than the second emission area LA2, and the second emission area LA2 may be larger in size than the third emission area LA3. For another example, the first emission area LA1, the second emission area LA2, and the third emission area LA3 may be substantially the same in size.

The display area DA of the display device 10 may include a light blocking area BA surrounding the emission areas LA. The light blocking area BA may prevent the colored lights emitted from the first to third emission areas LA1, LA2, and LA3 from mixing with one another.

Figure 3:
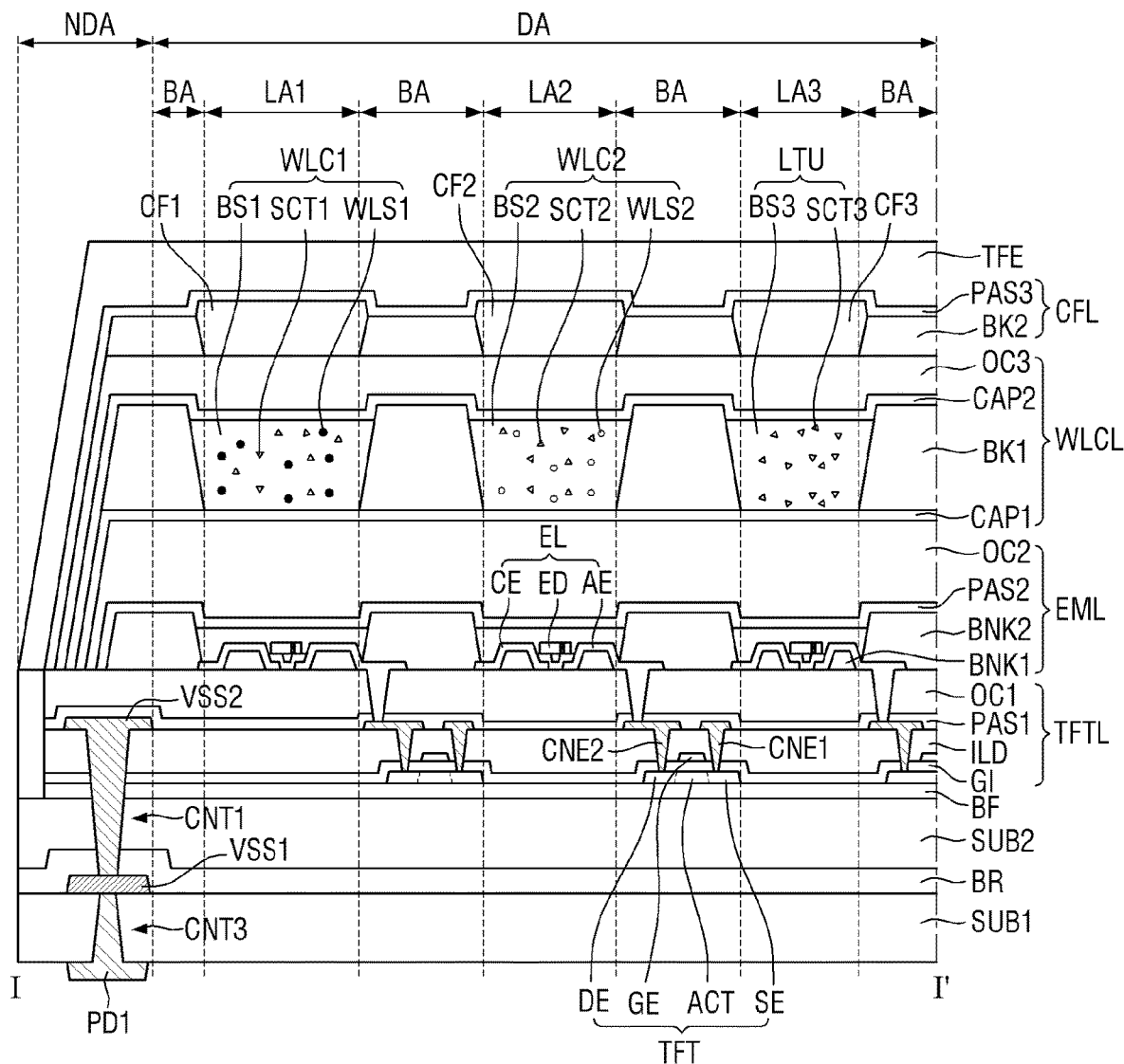
FIG. 3 is a schematic cross-sectional view of an example taken along line I-I' of FIG. 2.

FIG. 3 is a schematic cross-sectional view of an example taken along line I-I' of FIG. 2.

Referring to FIG. 3, the display area DA of the display device 10 may include first to third emission areas LA1, LA2, and LA3. Each of the first to third emission areas LA1, LA2, and LA3 may be an area in which light generated from a light emitting diode ED of the display device 10 is emitted to the outside of the display device 10.

The display device 10 may include a first substrate SUB1, a first voltage line VSS1, a barrier layer BR, a second substrate SUB2, a display layer DPL, and an encapsulation layer TFE.

The first substrate SUB1 may be a base substrate or a base member and may be made of (or include) an insulating material such as a polymer resin. The first substrate SUB1 may be a flexible substrate which can be bent, folded, or rolled. For example, the first substrate SUB1 may include polyimide (PI), but the disclosure is not limited thereto. For another example, the first substrate SUB1 may include a glass material or a metal material.

The first voltage line VSS1 may be disposed on at least one edge of the first substrate SUB1. The first voltage line VSS1 may be disposed in the non-display area NDA. The width of the first voltage line VSS1 may be substantially equal to the width of a second voltage line VSS2, in a plan view. For example, the width of the first voltage line VSS1 may range from 100 μm to 200 μm, in a plan view. The first voltage line VSS1 may supply a first voltage to the second voltage line VSS2. Here, the first voltage line VSS1 may be a low potential line, and the first voltage may be a low potential voltage.

The barrier layer BR may cover (or overlap) the first voltage line VSS1 and the first substrate SUB1. The barrier layer BR may include a first contact hole CNT1 provided in the non-display area NDA. The barrier layer BR may contain an inorganic material capable of preventing infiltration of air or moisture. For example, the barrier layer BR may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The second substrate SUB2 may be disposed on the barrier layer BR. The second substrate SUB2 may include the first contact hole CNT1 provided in the non-display area NDA. The second substrate SUB2 may be a base substrate or a base member and may be made of an insulating material such as a polymer resin. The second substrate SUB2 may be a flexible substrate which can be bent, folded, or rolled. For example, the second substrate SUB2 may include polyimide (PI), but the disclosure is not limited thereto.

The display layer DPL may be disposed on the second substrate SUB2. The display layer DPL may include a thin film transistor layer TFTL, a light emitting element layer EML, a wavelength conversion layer WLCL and a color filter layer CFL. The thin film transistor layer TFTL may include a buffer layer BF, a thin film transistor TFT, a gate insulating layer GI, an interlayer insulating layer ILD, the second voltage line VSS2, first and second connection electrodes CNE1 and CNE2, a first passivation layer PAS1, and a first planarization layer OC1.

The buffer layer BF may be disposed on the second substrate SUB2. The buffer layer BF may include the first contact hole CNT1 provided in the non-display area NDA. The buffer layer BF may be formed of an inorganic material capable of preventing infiltration of air or moisture. For example, the buffer layer BF may include inorganic films laminated alternately.

The thin film transistor TFT may be disposed on the buffer layer BF and may constitute a pixel circuit of each of the pixels. For example, the thin film transistor TFT may be a switching transistor or a driving transistor of the pixel circuit. The thin film transistor TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may overlap the gate electrode GE in a thickness direction and may be insulated from the gate electrode GE by the gate insulating layer GI. The source electrode SE and the drain electrode DE may be provided by making a material of the semiconductor region ACT conductive.

The gate electrode GE may be disposed on the gate insulating layer GI. The gate electrode GE may overlap the semiconductor region ACT with the gate insulating layer GI interposed therebetween.

The gate insulating layer GI may be provided on the semiconductor region ACT, the source electrode SE, and the drain electrode DE. For example, the gate insulating layer GI may cover the semiconductor region ACT, the source electrode SE, the drain electrode DE, and the buffer layer BF and may insulate the semiconductor region ACT from the gate electrode GE. The gate insulating layer GI may include the first contact hole CNT1 provided in the non-display area NDA. The gate insulating layer GI may include a contact hole through which each of the first and second connection electrodes CNE1 and CNE2 passes.

The interlayer insulating layer ILD may be disposed on the gate electrode GE. The interlayer insulating layer ILD may include the first contact hole CNT1 provided in the non-display area NDA. Accordingly, the first contact hole CNT1 may penetrate the interlayer insulating layer ILD, the gate insulating layer GI, the buffer layer BF, the second substrate SUB2, and the barrier layer BR in the non-display area NDA. The interlayer insulating layer ILD may include a contact hole through which each of the first and second connection electrodes CNE1 and CNE2 passes.

The second voltage line VSS2 may be disposed on at least one edge of the interlayer insulating layer ILD. The second voltage line VSS2 may be disposed in the non-display area NDA. The second voltage line VSS2 may overlap the first voltage line VSS1 in the thickness direction (e.g., Z-axis direction). The width of the second voltage line VSS2 may be substantially equal to the width of the first voltage line VSS1, in a plan view. For example, the width of the second voltage line VSS2 may range from about 100 μm to about 200 μm in a plan view.

The second voltage line VSS2 may be inserted into the first contact hole CNT1 and connected to the first voltage line VSS1. The second voltage line VSS2 may be electrically connected to a second electrode CE of a light emitting element EL. The second voltage line VSS2 may supply the first voltage supplied from the first voltage line VSS1 to the second electrode CE of the light emitting element EL. Here, the second voltage line VSS2 may be a low potential line, and the first voltage may be a low potential voltage.

The display device 10 may include the first voltage line VSS1 disposed on the first substrate SUB1 and the second voltage line VSS2 disposed in the thin film transistor layer TFTL, thereby relatively reducing the width of the second voltage line VSS2 in a plan view. Accordingly, the display device 10 may have a minimized or reduced area of the non-display area NDA in which the second voltage line VSS2 is disposed.

The display device 10 may have the first and second voltage lines VSS1 and VSS2 that are connected to each other through the first contact holes CNT1, thereby reducing the resistance of the first and second voltage lines VSS1 and VSS2. Accordingly, the display device 10 may supply a stable low potential voltage to the second electrode CE of each of the light emitting elements EL.

The first and second connection electrodes CNE1 and CNE2 may be disposed to be spaced apart from each other on the interlayer insulating layer ILD. The first connection electrode CNE1 may connect a data line or a power line to the source electrode SE of the thin film transistor TFT. The first connection electrode CNE1 may contact the source electrode SE through the contact holes provided in the interlayer insulating layer ILD and the gate insulating layer GI.

The second connection electrode CNE2 may connect the drain electrode DE of the thin film transistor TFT to a first electrode AE of the light emitting element EL. The second connection electrode CNE2 may contact the drain electrode DE through the contact holes provided in the interlayer insulating layer ILD and the gate insulating layer GI.

The first passivation layer PAS1 may cover the second voltage line VSS2, the first and second connection electrodes CNE1 and CNE2, and the interlayer insulating layer ILD. The first passivation layer PAS1 may protect the thin film transistor TFT. The first passivation layer PAS1 may include a contact hole through which the first electrode AE of the light emitting element EL passes.

The first planarization layer OC1 may be provided on the first passivation layer PAS1 to planarize a top portion of the thin film transistor layer TFTL. For example, the first planarization layer OC1 may include a contact hole through which the first electrode AE of the light emitting element EL passes. Here, the contact hole of the first planarization layer OC1 may be connected to the contact hole of the first passivation layer PAS1. The first planarization layer OC1 may include an organic material.

The light emitting element layer EML may include the light emitting element EL, a first bank BNK1, a second bank BNK2, a second passivation layer PAS2, and a second planarization layer OC2.

The light emitting element EL may be disposed on the thin film transistor layer TFTL. The light emitting element EL may include the first electrode AE, a second electrode CE, and the light emitting diode ED.

The first electrode AE may be disposed on the first planarization layer OC1. For example, the first electrode AE may be disposed on the first bank BNK1 provided on the first planarization layer OC1 to cover the first bank BNK1. The first electrode AE may be disposed to overlap one of the first to third emission areas LA1, LA2, and LA3 defined by the second bank BNK2. The first electrode AE may be connected to the drain electrode DE of the thin film transistor TFT through the second connection electrode CNE2. The first electrode AE may be an anode electrode of the light emitting element EL, but the disclosure is not limited thereto.

The second electrode CE may be disposed on the first planarization layer OC1 to be spaced apart from the first electrode AE. For example, the second electrode CE may be disposed on the first bank BNK1 disposed on the first planarization layer OC1 to cover the first bank BNK1. The second electrode CE may be disposed to overlap one of the first to third emission areas LA1, LA2, and LA3 defined by the second bank BNK2. For example, the second electrode CE may receive a low potential voltage supplied to all pixels from the second voltage line VSS2. The second electrode CE may be a cathode electrode of the light emitting element EL, but the disclosure is not limited thereto.

The light emitting diode ED may be disposed between the first electrode AE and the second electrode CE on the first planarization layer OC1. One end (or first end) of the light emitting diode ED may be connected to the first electrode AE, and the other end (or second end) of the light emitting diode ED may be connected to the second electrode CE. For example, light emitting diodes ED may include active layers having the same material and emit light of the same wavelength band or light of the same color. Light emitted from each of the first to third emission areas LA1, LA2, and LA3 may have the same color. For example, the light emitting diodes ED may emit the third color light or blue light having a peak wavelength in a range of about 440 nm to about 480 nm. Therefore, the light emitting element layer EML may emit the third color light or blue light.

The second bank BNK2 may be disposed in the light blocking area BA on the first planarization layer OC1. The second bank BNK2 may define the first to third emission areas LA1, LA2 and LA3. For example, the second bank BNK2 may surround each of the first to third emission areas LA1, LA2, and LA3, but the disclosure is not limited thereto. The second bank BNK2 may separate and insulate the first electrode AE or the second electrode CE of each of the light emitting elements EL.

The second passivation layer PAS2 may be disposed on the light emitting elements EL and the second bank BNK2. The second passivation layer PAS2 may cover the light emitting elements EL and may protect the light emitting elements EL. The second passivation layer PAS2 may prevent infiltration of impurities such as moisture or air from the outside to prevent damage to the light emitting elements EL.

The second planarization layer OC2 may be provided on the second passivation layer PAS2 to planarize a top portion of the light emitting element layer EML. For example, the second planarization layer OC2 may include an organic material.

The wavelength conversion layer WLCL may include a first capping layer CAP1, a first light blocking member BK1, a first wavelength conversion member WLC1, a second wavelength conversion member WLC2, a light transmission member LTU, a second capping layer CAP2, and a third planarization layer OC3.

The first capping layer CAP1 may be disposed on the second planarization layer OC2 of the light emitting element layer EML. The first capping layer CAP1 may seal the bottom surfaces of the light transmission member LTU and the first and second wavelength conversion members WLC1 and WLC2. For example, the first capping layer CAP1 may include an inorganic material.

The first light blocking member BK1 may be disposed in the light blocking area BA on the first capping layer CAP1.

The first light blocking member BK1 may overlap the second bank BNK2 in the thickness direction. The first light blocking member BK1 may block transmission of light. The first light blocking member BK1 may prevent light infiltration and color mixture between the first to third emission areas LA1, LA2, and LA3, which leads to the improvement of color reproducibility of the display device 10. The first light blocking member BK1 may be arranged in the form of a grid surrounding the first to third emission areas LA1, LA2, and LA3 in a plan view.

The first wavelength conversion member WLC1 may be disposed in the first emission area LA1 on the first capping layer CAP1. The first wavelength conversion member WLC1 may be surrounded by the first light blocking member BK1. The first wavelength conversion member WLC1 may include a first base resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. For example, the first scatterer SCT1 may contain a metallic oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change in the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in a range of about 610 nm to about 650 nm and emit the red light. The first wavelength shifter WLS1 may be a quantum dot, a quantum rod, or a fluorescent substance. The quantum dot may be a particulate material that emits light of a specific color in case that an electron transitions from a conduction band to a valence band.

A part of the blue light emitted from the light emitting element layer EML may pass through the first wavelength conversion member WLC1 without being converted to red light by the first wavelength shifter WLS1. As a part of the blue light emitted from the light emitting element layer EML, the light incident on the first color filter CF1 without being converted by the first wavelength conversion member WLC1 may be blocked by the first color filter CF1. The red light produced by the first wavelength conversion member WLC1 converting the blue light emitted from the light emitting element layer EML may pass through the first color filter CF1 to be emitted to the outside. Accordingly, the red light may be emitted from the first emission area LA1.

The second wavelength conversion member WLC2 may be disposed in the second emission area LA2 on the first capping layer CAP1. The second wavelength conversion member WLC2 may be surrounded by the first light blocking member BK1. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 and the first base resin BS1 may be made of the same material, or may be made of the material that may form the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. For example, the second scatterer SCT2 and the first scatterer SCT1 may be made of the same material, or the second scatterer SCT2 may be made of the material that may form the first scatterer SCT1.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in a range of about 510 nm to about 550 nm and emit the green light. The second wavelength shifter WLS2 may be a quantum dot, a quantum rod, or a fluorescent substance. The second wavelength shifter WLS2 may contain materials that may form the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed in the third emission area LA3 on the first capping layer CAP1. The light transmission member LTU may be surrounded by the first light blocking member BK1. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may be formed of a transparent organic material. For example, the third base resin BS3 and the first base resin BS1 or the second base resin BS2 may be made of the same material, or the third base resin BS3 may be made of the material that may form the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least a part of the transmitted light. For example, the third scatterer SCT3 and the first scatterer SCT1 or the second scatterer SCT2 may be formed of the same material, or the third scatterer SCT3 may be made of the material that may form the first scatterer SCT1 or the second scatterer SCT2.

Since the wavelength conversion layer WLCL is disposed directly on the second planarization layer OC2 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be easily aligned in the first to third emission areas LA1, LA2, and LA3, respectively, and the thickness of the display device 10 may be relatively reduced.

The second capping layer CAP2 may cover the first and second wavelength conversion members WLC1 and WLC2, the light transmission member LTU, and the first light blocking member BK1. For example, the second capping layer CAP2 may seal the first and second wavelength conversion members WLC1 and WLC2 and the light transmission member LTU to prevent the first and second wavelength conversion members WLC1 and WLC2 and the light transmission member LTU from damage or contamination. For example, the second capping layer CAP2 may include an inorganic material.

The third planarization layer OC3 may be disposed on the second capping layer CAP2 to planarize top portions of the first and second wavelength conversion members WLC1 and WLC2 and the light transmission member LTU. For example, the third planarization layer OC3 may include an organic material.

The color filter layer CFL may include a second light blocking member BK2, first to third color filters CF1, CF2, and CF3, and a third passivation layer PAS3.

The second light blocking member BK2 may be disposed in the light blocking area BA on the third planarization layer OC3 of the wavelength conversion layer WLCL. The second light blocking member BK2 may overlap the first light blocking member BK1 or the second bank BNK2 in the thickness direction. The second light blocking member BK2 may block transmission of light. The second light blocking member BK2 may prevent light infiltration and color mixture between the first to third emission areas LA1, LA2, and LA3, which leads to the improvement of color reproducibility of the display device 10. The second light blocking member BK2 may be arranged in the form of a grid surrounding the first to third emission areas LA1, LA2, and LA3 in a plan view.

The first color filter CF1 may be disposed in the first emission area LA1 on the third planarization layer OC3. The first color filter CF1 may be surrounded by the second light blocking member BK2. The first color filter CF1 may overlap the first wavelength conversion member WLC1 in the thickness direction. The first color filter CF1 may selectively allow the first color light (e.g., red light) to pass therethrough and block or absorb the second color light (e.g., green light) and the third color light (e.g., blue light). For example, the first color filter CF1 may be a red color filter and contain a red colorant.

The second color filter CF2 may be disposed in the second emission area LA2 on the third planarization layer OC3. The second color filter CF2 may be surrounded by the second light blocking member BK2. The second color filter CF2 may overlap the second wavelength conversion member WLC2 in the thickness direction. The second color filter CF2 may selectively allow the second color light (e.g., green light) to pass therethrough and block or absorb the first color light (e.g., red light) and the third color light (e.g., blue light). For example, the second color filter CF2 may be a green color filter and contain a green colorant.

The third color filter CF3 may be disposed in the third emission area LA3 on the third planarization layer OC3. The third color filter CF3 may be surrounded by the second light blocking member BK2. The third color filter CF3 may overlap the light transmission member LTU in the thickness direction. The third color filter CF3 may selectively allow the third color light (e.g., blue light) to pass therethrough and block or absorb the first color light (e.g., red light) and the second color light (e.g., green light). For example, the third color filter CF3 may be a blue color filter and contain a blue colorant.

The first to third color filters CF1, CF2, and CF3 may absorb a part of the light coming from the outside of the display device 10 to reduce the reflected light of the external light. This means that the first to third color filters CF1, CF2, and CF3 can prevent color distortion caused by the reflection of the external light.

Since the first to third color filters CF1, CF2, and CF3 are directly disposed on the third planarization layer OC3 of the wavelength conversion layer WLCL, the display device 10 may not require a separate substrate for the first to third color filters CF1, CF2, and CF3. Therefore, the thickness of the display device 10 may be relatively reduced.

The third passivation layer PAS3 may cover the first to third color filters CF1, CF2, and CF3. The third passivation layer PAS3 may protect the first to third color filters CF1, CF2, and CF3.

The encapsulation layer TFE may be disposed on the third passivation layer PAS3 of the color filter layer CFL. The encapsulation layer TFE may cover the top and side surfaces of a display layer. For example, the encapsulation layer TFE may include at least one inorganic film to prevent permeation of oxygen or moisture. The encapsulation layer TFE may include at least one organic film to protect the display device 10 from foreign substances such as dust.

Figure 4:
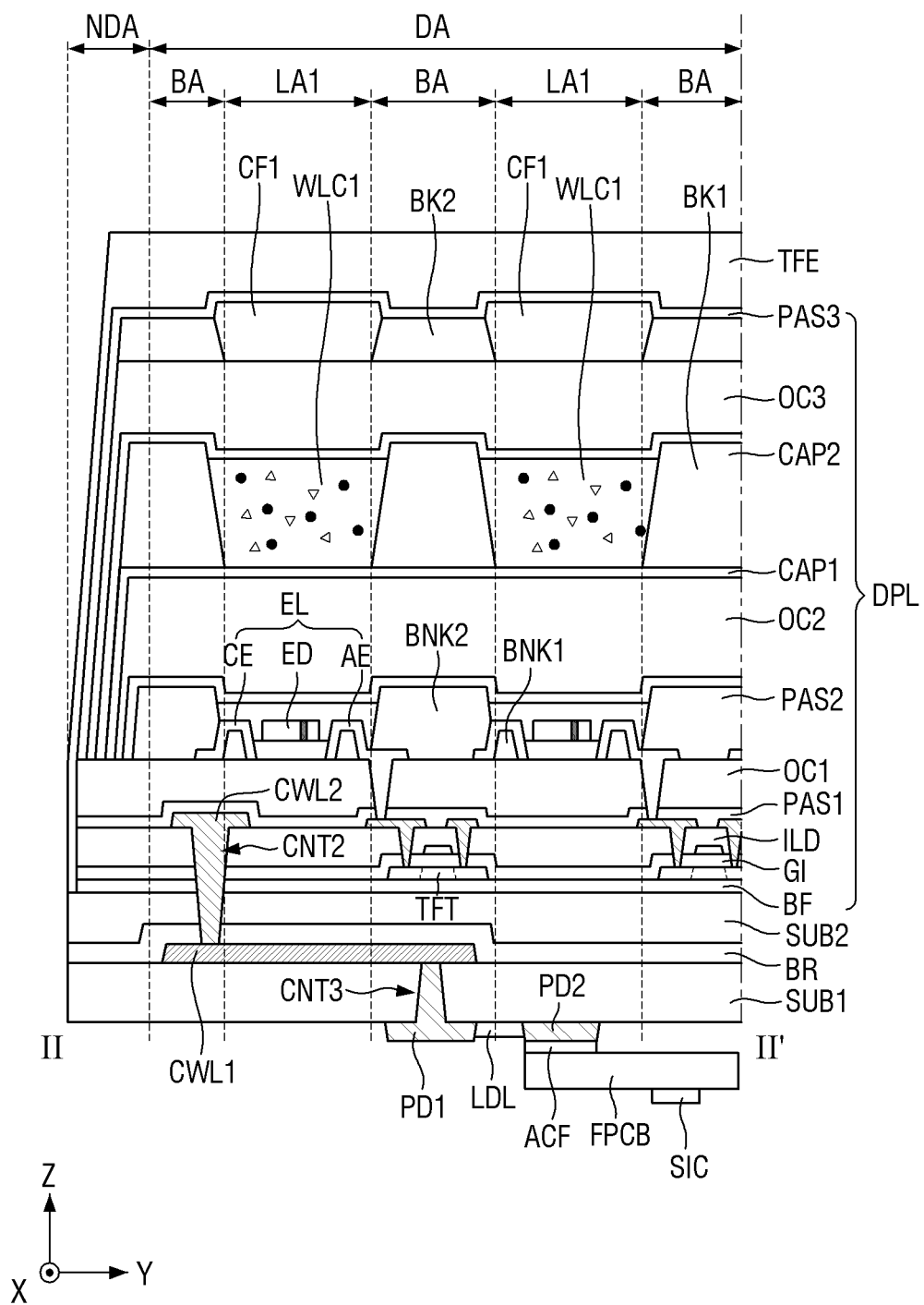
FIG. 4 is a schematic cross-sectional view taken along line II-II' of FIG. 2.

FIG. 4 is a schematic cross-sectional view taken along line II-II' of FIG. 2. Hereinafter, the same configurations as the above-described configurations will be briefly described, or a description thereof will be omitted.

Referring to FIG. 4, the display device 10 may include the first substrate SUB1, a first connection line CWL1, the barrier layer BR, the second substrate SUB2, the display layer DPL, and the encapsulation layer TFE.

The first substrate SUB1 may be a base substrate or a base member and may be made of an insulating material such as a polymer resin. For example, the first substrate SUB1 may include polyimide (PI), but the disclosure is not limited thereto. For another example, the first substrate SUB1 may include a glass material or a metal material.

The first substrate SUB1 may include a third contact hole CNT3 penetrating the first substrate SUB1 from the bottom surface thereof. For example, the third contact hole CNT3 may penetrate the first substrate SUB1 from its bottom surface to its top surface. The third contact hole CNT3 may be disposed to overlap the display area DA. The first pad unit (or first pad part) PD1 inserted into the third contact hole CNT3 may be disposed in the display area DA. Accordingly, the display device 10 may not include a separate pad part disposed at the outermost side, and a bezel area or dead space of the display device 10 may be minimized. Since the first pad part PD1 is disposed on the bottom surface of the display device 10, the gap between the display devices 10 can be further reduced than in case that the pad part is disposed on the outermost side of the substrate or in case that a flexible film is disposed on the side surface of the substrate.

The first connection line CWL1 may be disposed in the display area DA or the non-display area NDA on the first substrate SUB1. The first connection line CWL1 and the first voltage line VSS1 may be formed of the same material in the same layer. For example, the first connection line CWL1 may have a spider shape, but the disclosure is not limited thereto. The first connection line CWL1 may be connected to the first pad part PD1 inserted in the third contact hole CNT3. The first connection line CWL1 may supply an electric signal received from the first pad part PD1 to the thin film transistor layer TFTL through a second connection line CWL2.

The barrier layer BR may cover the first connection line CWL1 and the first substrate SUB1. The barrier layer BR may contain an inorganic material capable of preventing infiltration of air or moisture.

The second substrate SUB2 may be disposed on the barrier layer BR. The second substrate SUB2 may include a second contact hole CNT2 provided in the display area DA. The second substrate SUB2 may be a base substrate or a base member and may be made of an insulating material such as a polymer resin. For example, the second substrate SUB2 may include polyimide (PI), but the disclosure is not limited thereto.

The display layer DPL may be disposed on the second substrate SUB2. The display layer DPL may include the thin film transistor layer TFTL, the light emitting element layer EML, the wavelength conversion layer WLCL, and the color filter layer CFL shown in FIG. 3.

The thin film transistor layer TFTL may further include the second connection line CWL2 disposed on the interlayer insulating layer ILD. The second connection line CWL2 and the second voltage line VSS2 may be formed of the same material in the same layer. The second connection line CWL and the first and second connection electrodes CNE1 and CNE2 may be made of the same material in the same layer. The second connection line CWL2 may be inserted into the second contact hole CNT2 and connected to the first connection line CWL1 disposed on the first substrate SUB1. Here, the second contact hole CNT2 may penetrate the interlayer insulating layer ILD, the gate insulating layer GI, the buffer layer BF, the second substrate SUB2, and the barrier layer BR in the display area DA.

For example, the second connection line CWL2 may be connected to the data line to supply a data voltage to the thin film transistor TFT. For another example, the second connection line CWL2 may be connected to a power supply line to supply a power voltage to the thin film transistor TFT.

The display device 10 may include the third contact hole CNT3 provided in the first substrate SUB1, and the second contact hole CNT2 provided in the barrier layer BR, the second substrate SUB2, the buffer layer BF, the gate insulating layer GI, and the interlayer insulating layer ILD, thereby supplying a signal of the first pad part PD1 to the thin film transistor layer TFTL with the first connection line CWL1 and the second connection line CWL2. The third contact hole CNT3 may be spaced apart from the second contact hole CNT2 in a plan view. The display device 10 may have multiple contact holes, and thus the depth of each of the second and third contact holes CNT2 and CNT3 may be reduced, compared to the case where only one contact hole is formed to penetrate from the interlayer insulating layer ILD to the first substrate SUB1. Accordingly, the display device 10 may have reduced thicknesses of the second connection line CWL2 and the first pad part PD1 inserted in the second and third contact holes CNT2 and CNT3, respectively.

The first pad part PD1 may be disposed on the bottom surface of the first substrate SUB1 and inserted into the third contact hole CNT3 to be connected to the first connection line CWL1. The first pad part PD1 may be connected between a second pad part PD2 and the first connection line CWL1.

The second pad part PD2 may be disposed on the bottom surface of the first substrate SUB1 and may be spaced apart from the first pad part PD1. The second pad part PD2 may be connected to the first pad part PD1 by a lead line LDL. The second pad part PD2 may receive various voltages or signals from the flexible film FPCB and may supply the corresponding voltages or signals to the first pad part PD1, the first connection line CWL1, and the second connection line CWL2.

A connection film ACF may attach the flexible film FPCB to the second pad part PD2. A surface of the connection film ACF may be attached to the second pad part PD2, and another surface of the connection film ACF may be attached to the flexible film FPCB. For example, the connection film ACF may cover the entire second pad part PD2, but the disclosure is not limited thereto.

The connection film ACF may include an anisotropic conductive film. In case that the connection film ACF includes an anisotropic conductive film, the connection film ACF may have conductivity in a region where the second pad part PD2 and a contact pad of the flexible film FPCB contact each other and may electrically connect the flexible film FPCB to the second pad part PD2.

The flexible film FPCB may be disposed on the bottom surface of the first substrate SUB1. A side of the flexible film FPCB may be connected to the second pad part PD2, and another side of the flexible film FPCB may be connected to a source circuit board (not shown) on the bottom surface of the first substrate SUB1. The flexible film FPCB may transmit a signal from a data driver SIC to the display device 10. For example, the data driver SIC may be an integrated circuit (IC). In response to a data control signal of a timing controller, the data driver SIC may convert digital video data into an analog data voltage and may supply it to a data line of the display area DA through the flexible film FPCB.

Figure 5:
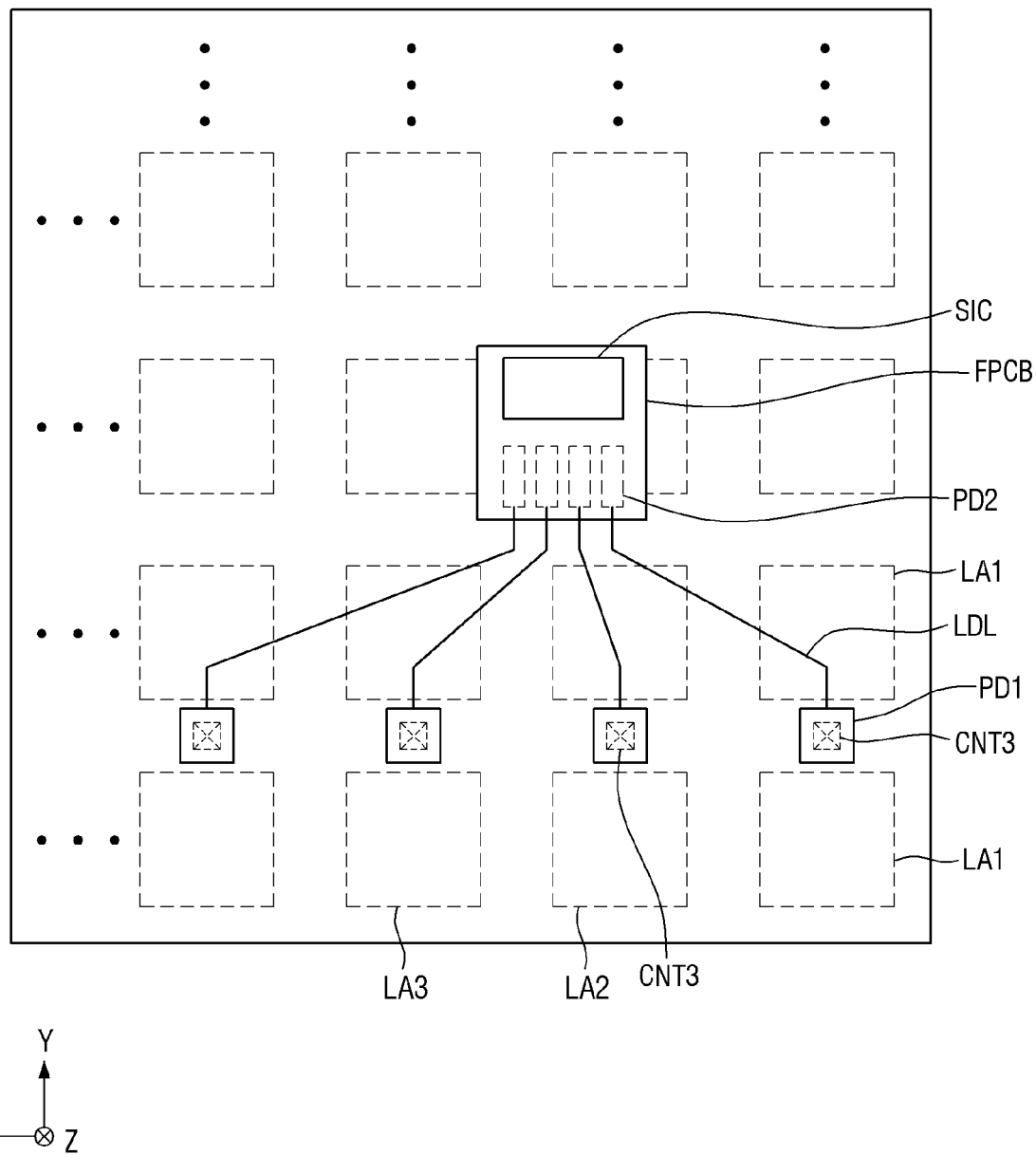
FIG. 5 is a schematic bottom view illustrating a display device according to an embodiment.

FIG. 5 is a schematic bottom view illustrating a display device according to an embodiment.

Referring to FIG. 5, the first pad part PD1 may be disposed on the bottom surface of the first substrate SUB1. For example, the first pad part PD1 may be inserted into the third contact hole CNT3 and connected to the first connection line CWL1. The first pad part PD1 may supply a data voltage or a power voltage received from the flexible film FPCB to the first connection line CWL1.

For another example, the first pad part PD1 may be inserted into the third contact hole CNT3 and connected to the first voltage line VSS1. The first pad part PD1 may supply a first voltage received from the flexible film FPCB to the first voltage line VSS1. Here, the first voltage line VSS1 may be a low potential line, and the first voltage may be a low potential voltage.

For example, the third contact hole CNT3 may be formed by removing the lower portion of the first substrate SUB1 by a laser etching process, but the disclosure is not limited thereto. Each of the first pad parts PD1 may correspond to each of the third contact holes CNT3. The display device 10 may have each of the third contact holes CNT3 corresponding to each of the first pad units PD1 by using the laser etching process.

The second pad part PD2 may be disposed on the bottom surface of the first substrate SUB1 and may be spaced apart from the first pad part PD1. The second pad part PD2 may be electrically connected to the first pad part PD1 through the lead line LDL. The second pad part PD2 may receive various voltages or signals from the flexible film FPCB and may supply the corresponding voltages or signals to the first connection line CWL1 or the first voltage line VS through the first pad part PD1.

The flexible film FPCB may be disposed on the bottom surface of the first substrate SUB1. A side of the flexible film FPCB may be connected to the second pad part PD2, and another side of the flexible film FPCB may be connected to a source circuit board (not shown) on the bottom surface of the first substrate SUB1. The flexible film FPCB may transmit a signal from the data driver SIC to the display device 10.

Figure 6:
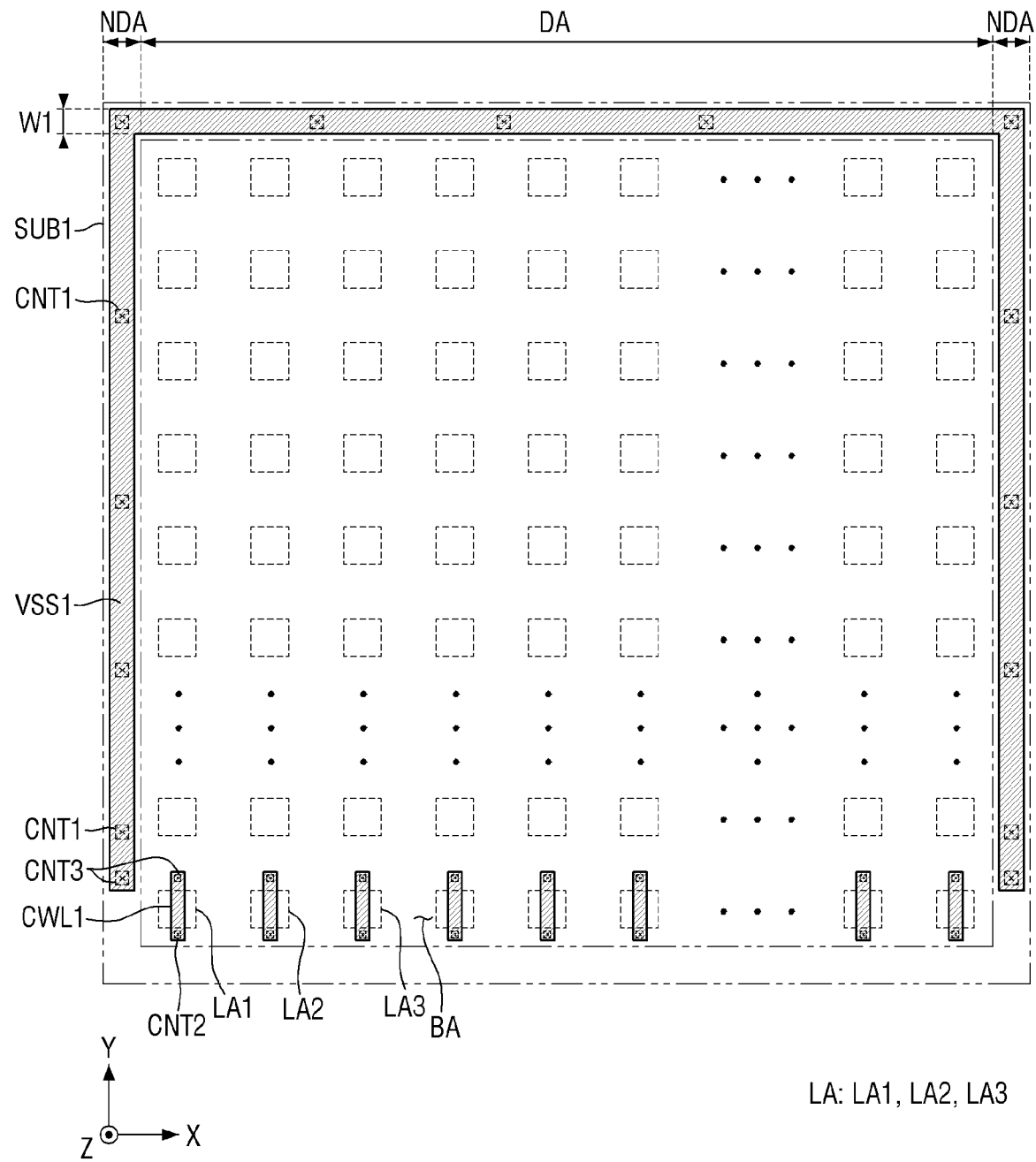
FIG. 6 is a schematic plan view illustrating a first voltage line and a first connection line in a display device according to an embodiment.
Figure 7:
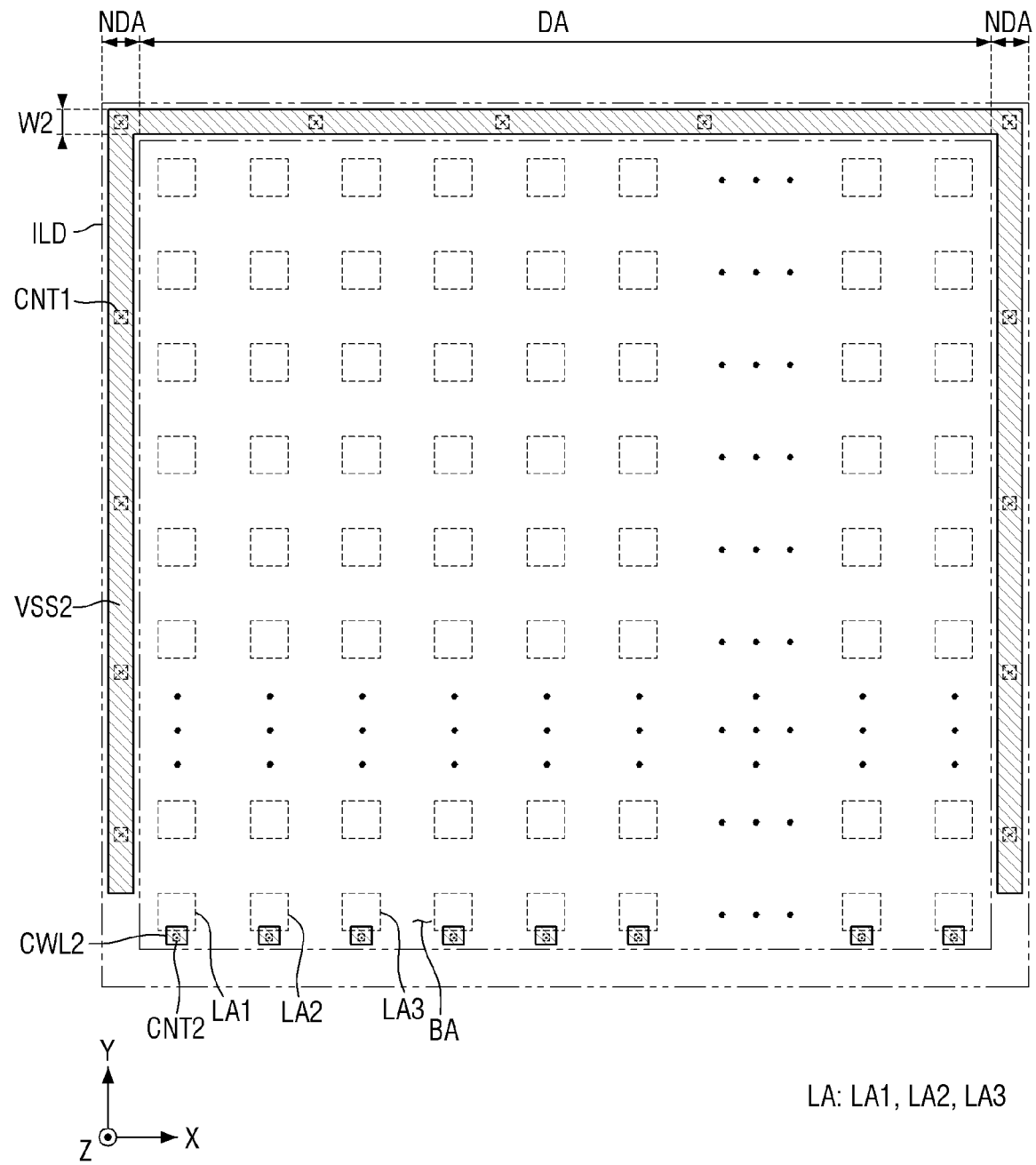
FIG. 7 is a schematic plan view illustrating a second voltage line and a second connection line in a display device according to an embodiment.

FIG. 6 is a schematic plan view illustrating a first voltage line and a first connection line in a display device according to an embodiment, and FIG. 7 is a schematic plan view illustrating a second voltage line and a second connection line in a display device according to an embodiment.

Referring to FIGS. 6 and 7, the first voltage line VSS1 may be disposed on at least one edge of the first substrate SUB1. The first voltage line VSS1 may be disposed in the non-display area NDA. For example, the first voltage line VSS1 may be disposed on the left edge, the upper edge, and the right edge of the non-display area NDA to surround a part of the display area DA. A width W1 of the first voltage line VSS1 may be substantially equal to a width W2 of the second voltage line VSS2, in a plan view. The width W1 of the first voltage line VSS1 may range from about 100 μm to about 200 μm in a plan view. The first voltage line VSS1 may be connected to the second voltage line VSS2 inserted in the first contact holes CNT1. The first voltage line VSS1 may supply the first voltage to the second voltage line VSS2. Here, the first voltage line VSS1 may be a low potential line, and the first voltage may be a low potential voltage.

The first connection line CWL1 may be disposed in the display area DA on the first substrate SUB1, but the disclosure is not limited thereto. The first connection lines CWL1 may be disposed on an edge of the display area DA. For example, the first connection line CWL1 may be disposed on the lower edge of the display area DA. Accordingly, the first connection lines CWL1 may be disposed on an edge of the display area DA that is not surrounded by the first voltage line VSS1. For another example, the first connection line CWL1 may be disposed in the non-display area NDA on the first substrate SUB1.

The first connection line CWL1 and the first voltage line VSS1 may be formed of the same material in the same layer. For example, the first connection line CWL1 may have a spider shape, but the disclosure is not limited thereto. A first end of the first connection line CWL1 may be connected to the second connection line CWL2 inserted in the second contact hole CNT2, and a second end of the first connection line CWL1 may be connected to the first pad part PD1 inserted in the third contact hole CNT3. The first connection line CWL1 may supply an electric signal received from the first pad part PD1 to the thin film transistor layer TFTL through the second connection line CWL2.

The second voltage line VSS2 may be disposed on at least one edge of the interlayer insulating layer ILD. The second voltage line VSS2 may be disposed in the non-display area NDA. For example, the second voltage line VSS2 may be disposed on the left edge, the upper edge, and the right edge of the non-display area NDA to surround a part of the display area DA. The second voltage line VSS2 may be inserted into the first contact holes CNT1 and connected to the first voltage line VSS1. The second voltage line VSS2 may overlap the first voltage line VSS1 in the thickness direction (e.g., Z-axis direction). The width W2 of the second voltage line VSS2 may be substantially equal to the width W1 of the first voltage line VSS1, in a plan view. For example, the width W2 of the second voltage line VSS2 may range from about 100 μm to about 200 μm in a plan view. The second voltage line VSS2 may be electrically connected to a second electrode CE of a light emitting element EL. The second voltage line VSS2 may supply the first voltage supplied from the first voltage line VSS1 to the second electrode CE of the light emitting element EL. Here, the second voltage line VSS2 may be a low potential line, and the first voltage may be a low potential voltage.

The second connection line CWL2 may be disposed in the display area DA on the interlayer insulating layer ILD. The second connection lines CWL2 may be disposed on an edge of the display area DA. For example, the second connection line CWL2 may be disposed on the lower edge of the display area DA. Accordingly, the second connection lines CWL2 may be disposed on an edge of the display area DA that is not surrounded by the second voltage line VSS2.

The second connection line CWL2 and the second voltage line VSS2 may be formed of the same material in the same layer. The second connection line CWL2 may be inserted into the second contact hole CNT2 and connected to the first connection line CWL1 disposed on the first substrate SUB1. For example, the second connection line CWL2 may be connected to the data line to supply a data voltage to the thin film transistor TFT. For another example, the second connection line CWL2 may be connected to a power supply line to supply a power voltage to the thin film transistor TFT.

The display device 10 may include the first voltage line VSS1 disposed on the first substrate SUB1 and the second voltage line VSS2 disposed in the thin film transistor layer TFTL, thereby relatively reducing the width of the second voltage line VSS2 in a plan view. Accordingly, the display device 10 may have a minimized area of the non-display area NDA in which the second voltage line VSS2 is disposed.

The display device 10 may have the first and second voltage lines VSS1 and VSS2 connected to each other through the first contact holes CNT1, thereby reducing the resistance of the first and second voltage lines VSS1 and VSS2. Accordingly, the display device 10 may supply a stable low potential voltage to the second electrode CE of each of the light emitting elements EL.

Figure 8:
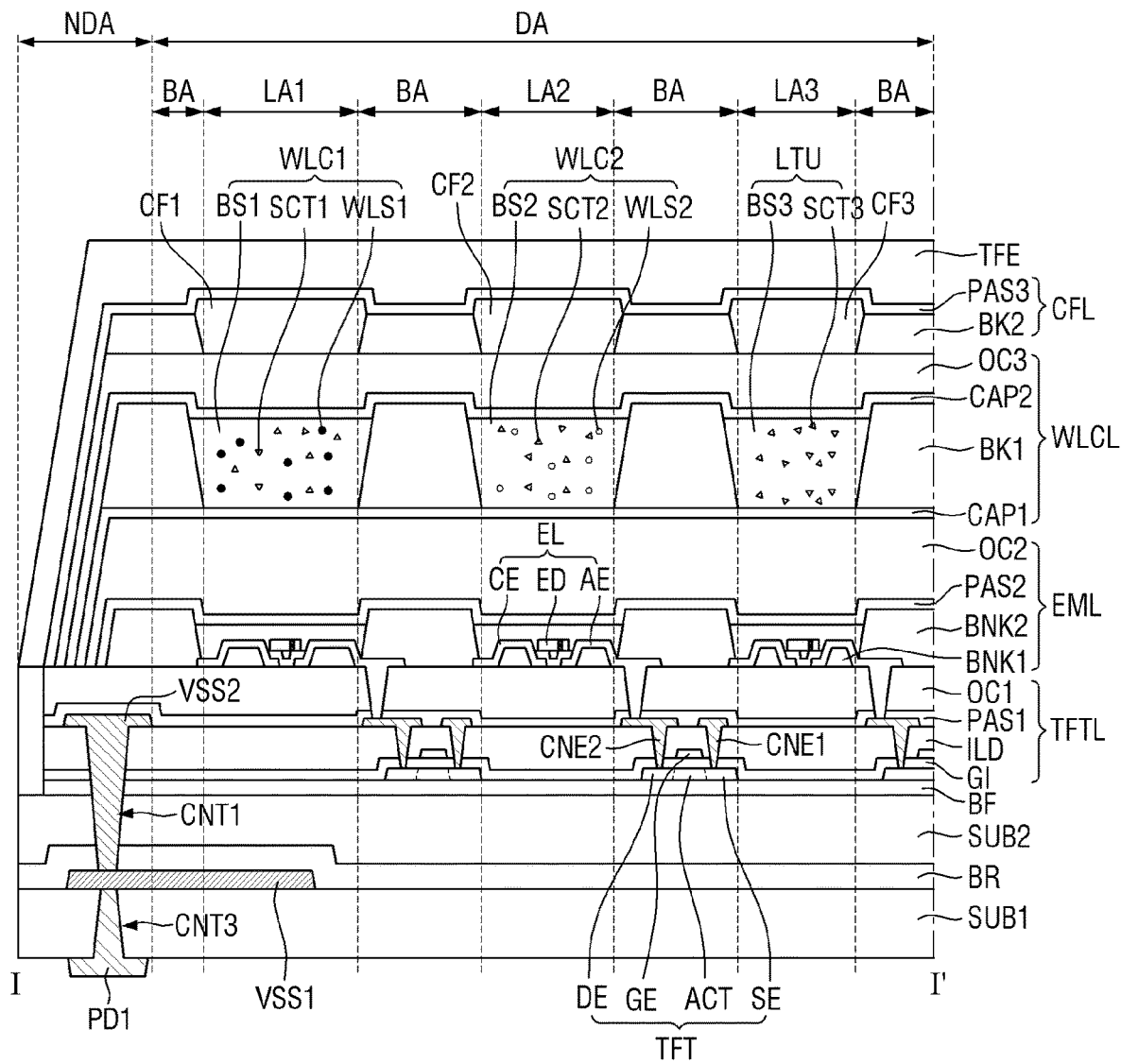
FIG. 8 is a schematic cross-sectional view of another example taken along line I-I' of FIG. 2.
Figure 9:
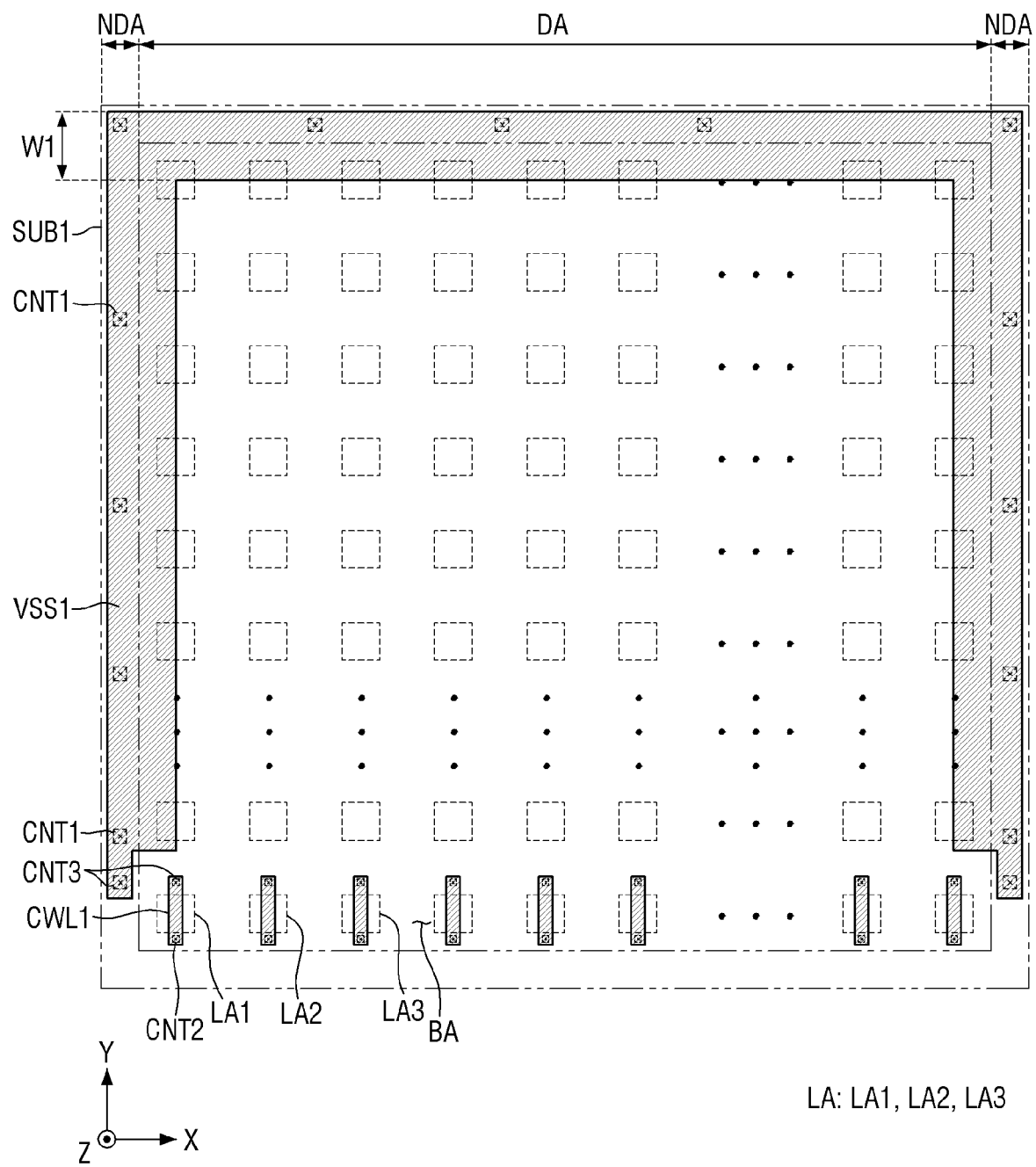
FIG. 9 is a schematic plan view illustrating a first voltage line and a first connection line in a display device according to another embodiment.

FIG. 8 is a schematic cross-sectional view of an example taken along line I-I' of FIG. 2, and FIG. 9 is a schematic plan view illustrating a first voltage line and a first connection line in a display device according to another embodiment. Here, the display device of FIGS. 8 and 9 may include the second voltage line VSS2 and the second connection line CWL2 shown in FIG. 7.

Referring to FIGS. 8 and 9, the display device 10 may include the first substrate SUB1, the first voltage line VSS1, the first connection line CWL1, the barrier layer BR, the second substrate SUB2, the display layer DPL, and the encapsulation layer TFE.

The first voltage line VSS1 may be disposed on at least one edge of the first substrate SUB1. The first voltage line VSS1 may be disposed on the edge of the display area DA and in the non-display area NDA. A part of the first voltage line VSS1 may overlap the emission area LA disposed at the edge of the display area DA. The width W1 of the first voltage line VSS1 may be greater than the width W2 of the second voltage line VSS2, in a plan view. For example, the width W1 of the first voltage line VSS1 may exceed about 200 μm in a plan view. The width W1 of the first voltage line VSS1 may be more than twice the width W2 of the second voltage line VSS2, in a plan view, but the disclosure is not limited thereto. The first voltage line VSS1 may supply the first voltage to the second voltage line VSS2. Here, the first voltage line VSS1 may be a low potential line, and the first voltage may be a low potential voltage.

The display layer DPL may include the thin film transistor layer TFTL, a light emitting element layer EML, a wavelength conversion layer WLCL and a color filter layer CFL. The thin film transistor layer TFTL may include the buffer layer BF, the thin film transistor TFT, the gate insulating layer GI, the interlayer insulating layer ILD, the second voltage line VSS2, the second connection line CWL2, the first and second connection electrodes CNE1 and CNE2, the first passivation layer PAS1, and the first planarization layer OC1.

The second voltage line VSS2 may be disposed on at least one edge of the interlayer insulating layer ILD. The second voltage line VSS2 may be disposed in the non-display area NDA. The second voltage line VSS2 may overlap the first voltage line VSS1 in the thickness direction (e.g., Z-axis direction). The width W2 of the second voltage line VSS2 may be smaller than the width W1 of the first voltage line VSS1, in a plan view. For example, the width W2 of the second voltage line VSS2 may range from about 100 μm to about 200 μm in a plan view.

The second voltage line VSS2 may be inserted into the first contact hole CNT1 and connected to the first voltage line VSS1. The second voltage line VSS2 may be electrically connected to a second electrode CE of a light emitting element EL. The second voltage line VSS2 may supply the first voltage supplied from the first voltage line VSS1 to the second electrode CE of the light emitting element EL. Here, the second voltage line VSS2 may be a low potential line, and the first voltage may be a low potential voltage.

The display device 10 may include the first voltage line VSS1 disposed on the first substrate SUB1 and the second voltage line VSS2 disposed in the thin film transistor layer TFTL, thereby relatively reducing the width of the second voltage line VSS2 in a plan view. For example, as the width W1 of the first voltage line VSS1 increases in a plan view, the width W2 of the second voltage line VSS2 may decrease in a plan view. Accordingly, the display device 10 may have a minimized area of the non-display area NDA in which the second voltage line VSS2 is disposed.

The display device 10 may have the first and second voltage lines VSS1 and VSS2 connected to each other through the first contact holes CNT1, thereby reducing the resistance of the first and second voltage lines VSS1 and VSS2 without increasing the width of the second voltage line VSS2 in a plan view. Accordingly, the display device 10 may supply a stable low potential voltage to the second electrode CE of each of the light emitting elements EL.

Figure 10:
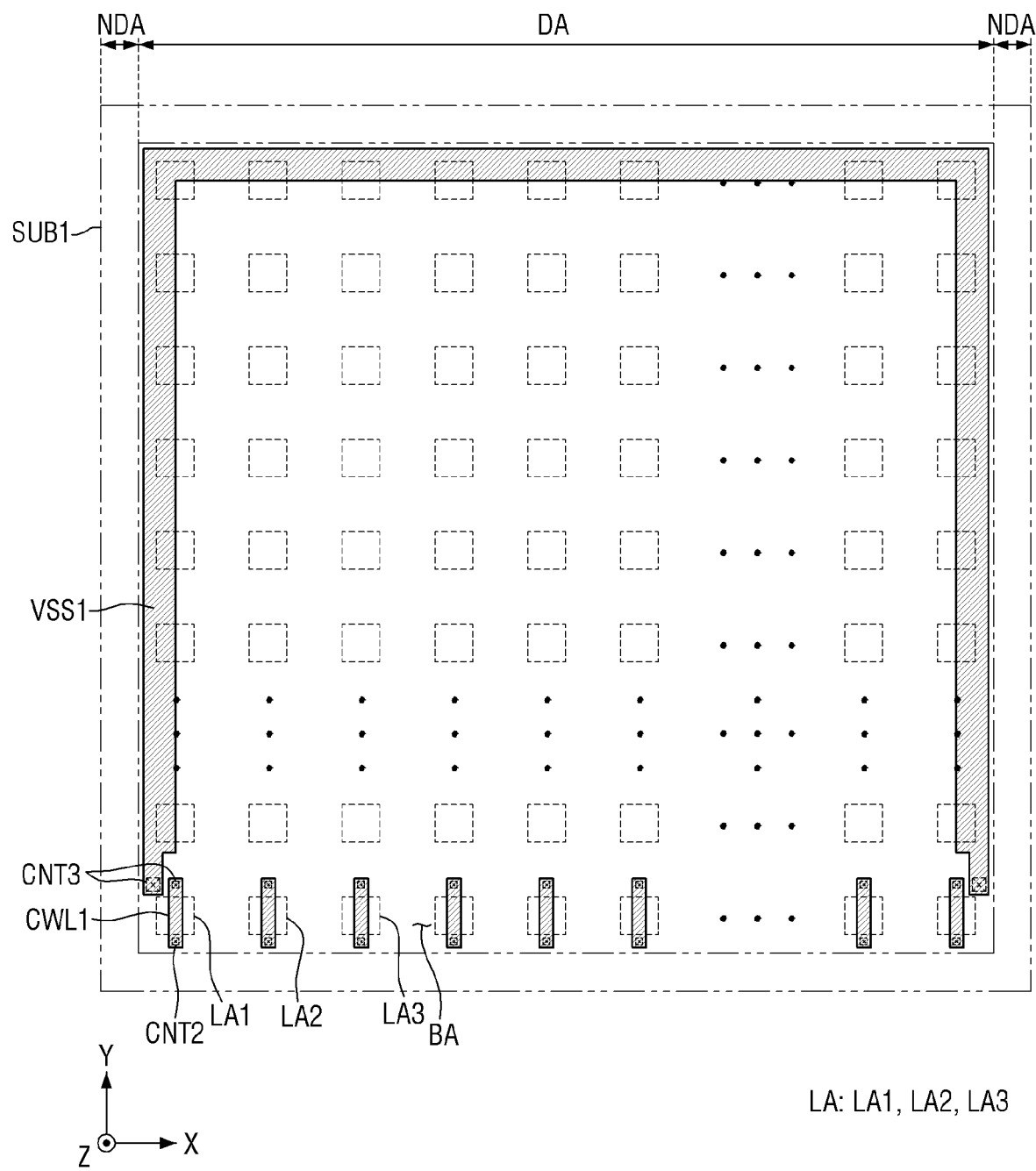
FIG. 10 is a schematic plan view illustrating a first voltage line and a first connection line in a display device according to still another embodiment.
Figure 11:
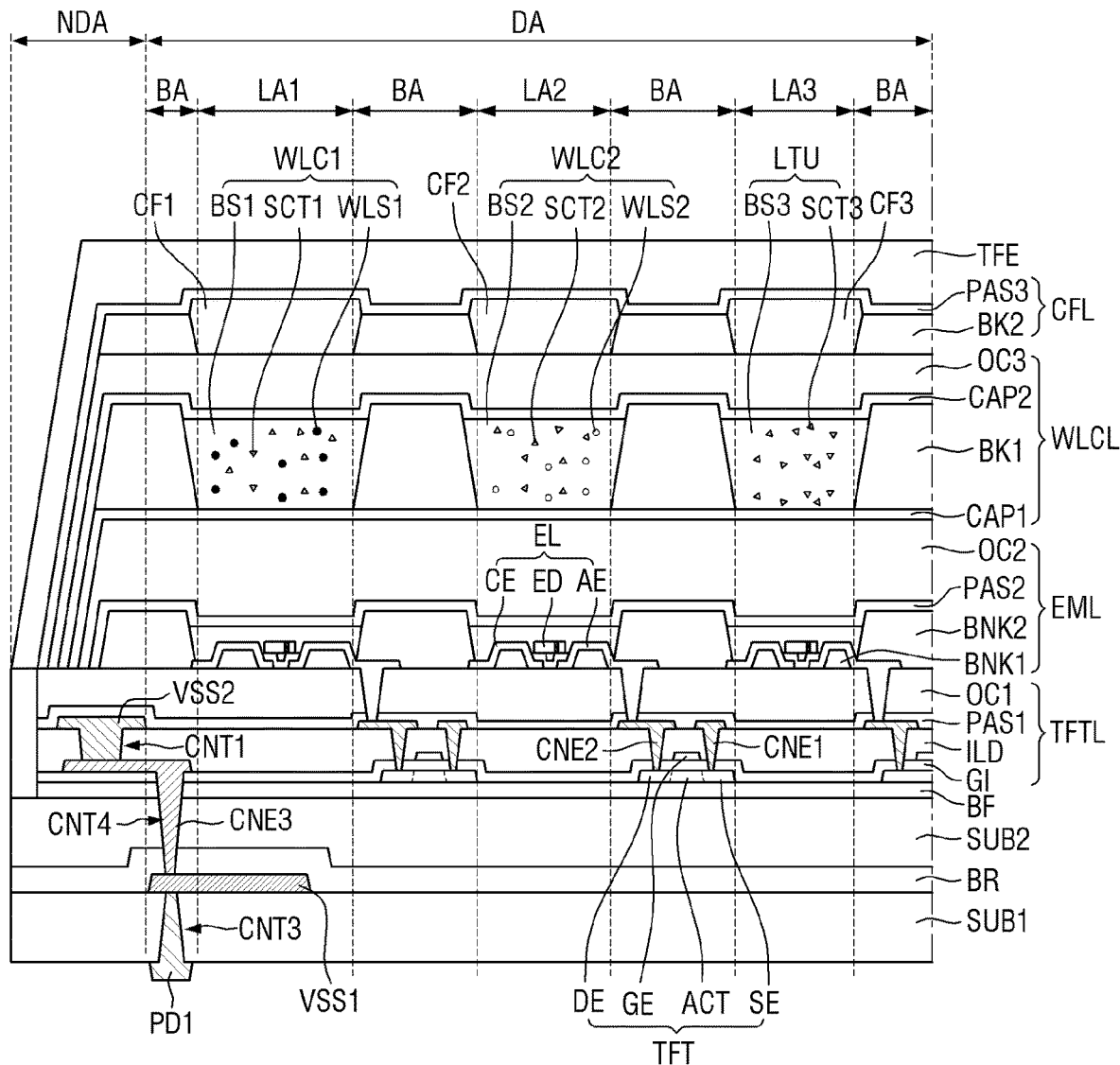
FIG. 11 is a schematic cross-sectional view of a display device according to still another embodiment.

FIG. 10 is a schematic plan view illustrating a first voltage line and a first connection line in a display device according to still another embodiment, and FIG. 11 is a schematic cross-sectional view of a display device according to still another embodiment. A display device of FIGS. 10 and 11 may include the second voltage line VSS2 and the second connection line CWL2 shown in FIG. 7.

Referring to FIGS. 10 and 11, the display device 10 may include the first substrate SUB1, the first voltage line VSS1, the first connection line CWL1, the barrier layer BR, the second substrate SUB2, the display layer DPL, and the encapsulation layer TFE.

The first voltage line VSS1 may be disposed on the edge of the display area DA on the first substrate SUB1. A part of the first voltage line VSS1 may overlap the emission area LA disposed at the edge of the display area DA. The first voltage line VSS1 may supply the first voltage to the second voltage line VSS2. Here, the first voltage line VSS1 may be a low potential line, and the first voltage may be a low potential voltage.

The display layer DPL may include the thin film transistor layer TFTL, a light emitting element layer EML, a wavelength conversion layer WLCL, and a color filter layer CFL. The thin film transistor layer TFTL may include the buffer layer BF, the thin film transistor TFT, the gate insulating layer GI, a third connection electrode CNE3, the interlayer insulating layer ILD, the second voltage line VSS2, the second connection line CWL2, the first and second connection electrodes CNE1 and CNE2, the first passivation layer PAS1, and the first planarization layer OC1.

The third connection electrode CNE3 may be disposed on the gate insulating layer GI. The third connection electrode CNE3 may be inserted into a fourth contact hole CNT4 and connected to the first voltage line VSS1. The third connection electrode CNE3 may be connected to the second voltage line VSS2 inserted in the first contact hole CNT1. Accordingly, the third connection electrode CNE3 may electrically connect the first voltage line VSS1 disposed in the display area DA to the second voltage line VSS2 disposed in the non-display area NDA.

The second voltage line VSS2 may be disposed on at least one edge of the interlayer insulating layer ILD. The second voltage line VSS2 may be disposed in the non-display area NDA. The second voltage line VSS2 may be inserted into the first contact hole CNT1 and connected to the third connection electrode CNE3. The second voltage line VSS2 may be electrically connected to the second electrode CE of the light emitting element EL. The second voltage line VSS2 may supply the first voltage supplied from the first voltage line VSS1 to the second electrode CE of the light emitting element EL. Here, the second voltage line VSS2 may be a low potential line, and the first voltage may be a low potential voltage.

The display device 10 may include the first voltage line VSS1 disposed on the first substrate SUB1 and the second voltage line VSS2 disposed in the thin film transistor layer TFTL, thereby relatively reducing the width of the second voltage line VSS2 in a plan view. For example, as the width W1 of the first voltage line VSS1 increases in a plan view, the width W2 of the second voltage line VSS2 may decrease in a plan view. Accordingly, the display device 10 may have a minimized area of the non-display area NDA in which the second voltage line VSS2 is disposed.

The display device 10 may have the first and second voltage lines VSS1 and VSS2 connected to each other through third connection electrodes CNE3, thereby reducing the resistance of the first and second voltage lines VSS1 and VSS2 without increasing the width of the second voltage line VSS2 in a plan view. Accordingly, the display device 10 may supply a stable low potential voltage to the second electrode CE of each of the light emitting elements EL.

Figure 12:
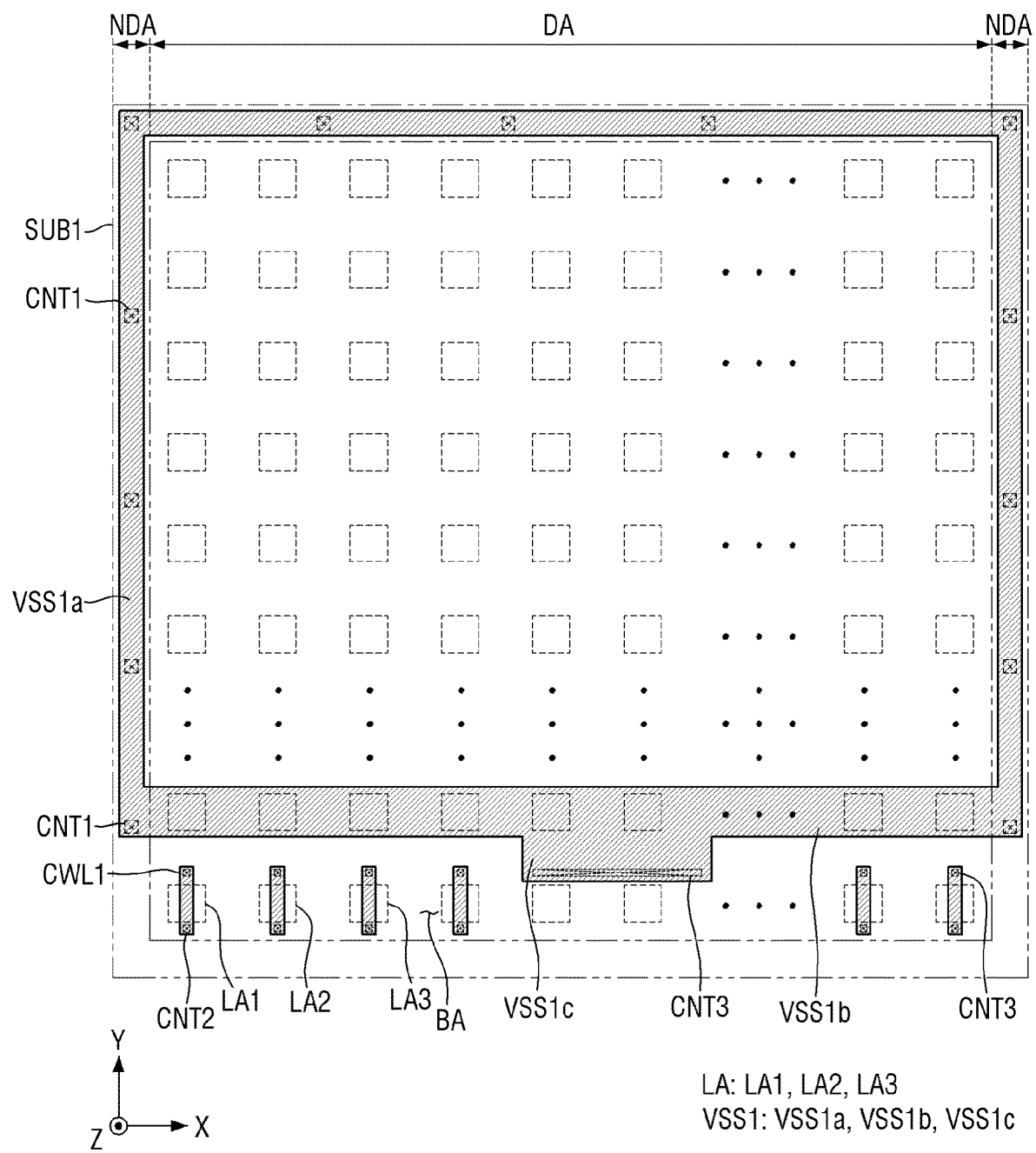
FIG. 12 is a schematic plan view illustrating a first voltage line and a first connection line in a display device according to still another embodiment.

FIG. 12 is a schematic plan view illustrating a first voltage line and a first connection line in a display device according to still another embodiment.

Referring to FIG. 12, the first voltage line VSS1 may include first to third portions VSS1a, VSS1b, and VSS1c.

The first portion VSS1a of the first voltage line VSS1 may be disposed on at least one edge of the first substrate SUB1. The first portion VSS1a of the first voltage line VSS1 may be disposed in the non-display area NDA. For example, the first portion VSS1a of the first voltage line VSS1 may be disposed on the left edge, the upper edge, and the right edge of the non-display area NDA to surround a part of the display area DA. The width of the first portion VSS1a of the first voltage line VSS1 may range from about 100 μm to about 200 μm in a plan view.

The second portion VSS1*b* of the first voltage line VSS1 may extend from the first portion VSS1*a* to traverse the display area DA. For example, the second portion VSS1*b* of the first voltage line VSS1 may extend from a first (or left) end of the first portion VSS1*a* to a second (or right) end of the first portion VSS1*a*. The first portion VSS1*a* and the second portion VSS1*b* of the first voltage line VSS1 may have a closed loop shape surrounding at least a part of the display area DA.

The third portion VSS1*c* of the first voltage line VS may protrude from the second portion VSS1*b* in the display area DA. For example, the third portion VSS1*c* of the first voltage line VSS1 may have a tubular pad shape. The aspect ratio of the third portion VSS1*c* of the first voltage line VSS1 may be smaller than the aspect ratio of the second portion VSS1*b* of the first voltage line VSS1. The third portion VSS1*c* of the first voltage line VSS1 may be connected to the first pad part PD1 through the third contact hole CNT3 to receive a low potential voltage from the flexible film FPCB. The display device 10 may further include the second and third portions VSS1*b* and VSS1*c* of the first voltage line VSS1, thereby reducing the resistance between the first voltage line VSS1 and the first pad part PD1.

Figure 13:
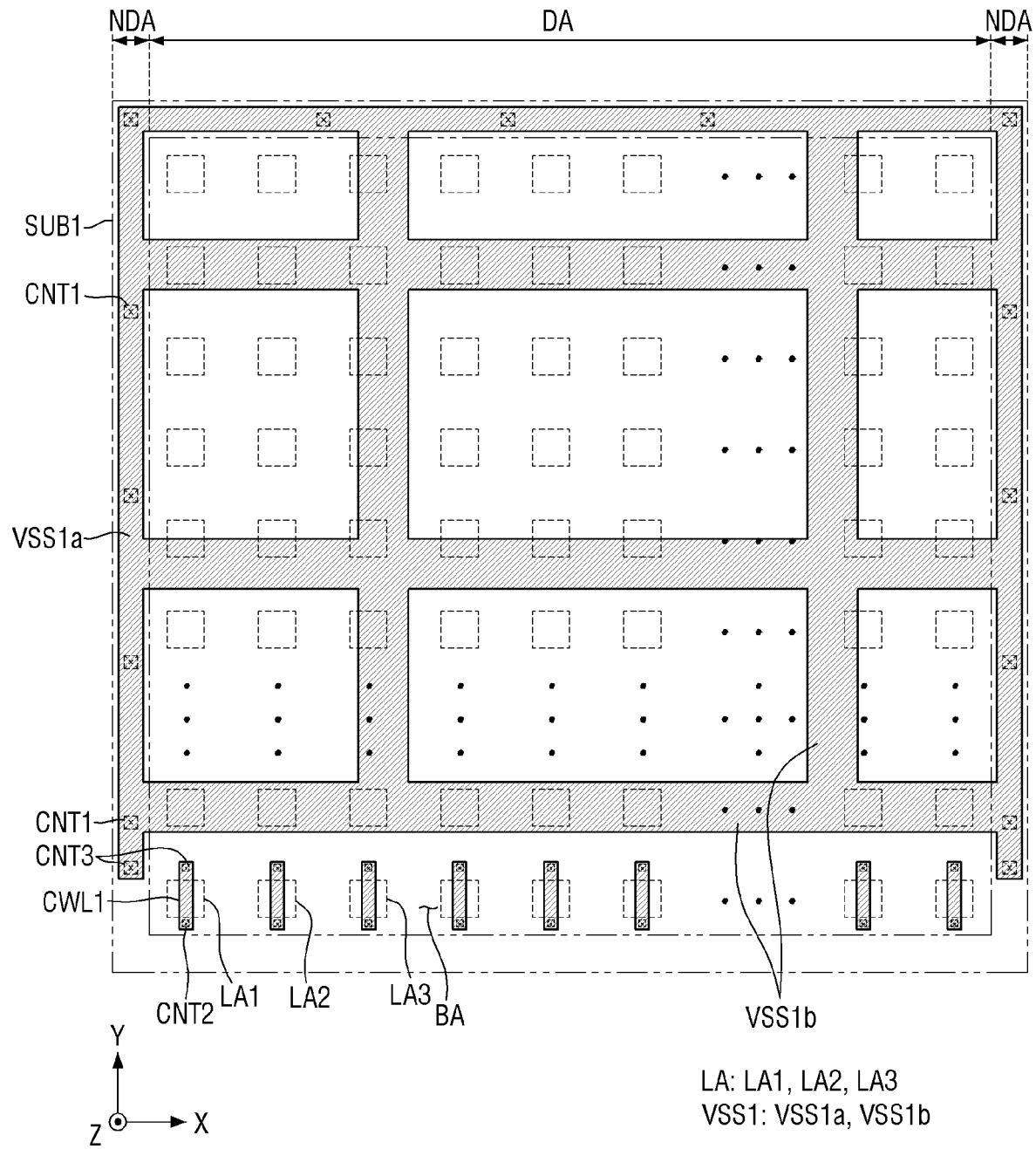
FIG. 13 is a schematic plan view showing a first voltage line and a first connection line in a display device according to still another embodiment.

FIG. 13 is a schematic plan view illustrating a first voltage line and a first connection line in a display device according to still another embodiment.

Referring to FIG. 13, the first voltage line VSS1 may include first and second portions VSS1*a* and VSS1*b*.

The first portion VSS1*a* of the first voltage line VSS1 may be disposed on at least one edge of the first substrate SUB1. The first portion VSS1*a* of the first voltage line VSS1 may be disposed in the non-display area NDA. For example, the first portion VSS1*a* of the first voltage line VSS1 may be disposed on the left edge, the upper edge, and the right edge of the non-display area NDA to surround a part of the display area DA. The width of the first portion VSS1*a* of the first voltage line VSS1 in a plan view may range from about 100 µm to about 200 µm.

The second portion VSS1*b* of the first voltage line VSS1 may have a grid shape in the display area DA. The second portion VSS1*b* of the first voltage line VSS1 may extend in the first direction (e.g., X-axis direction) and the second direction (e.g., Y-axis direction). The second portion VSS1*b* of the first voltage line VSS1 may overlap the emission area LA and the light blocking area BA in the thickness direction (e.g., Z-axis direction). The display device 10 may further include the second portion VSS1*b* of the first voltage line VSS1, thereby reducing the resistance of the first voltage line VSS1.

Figure 14:
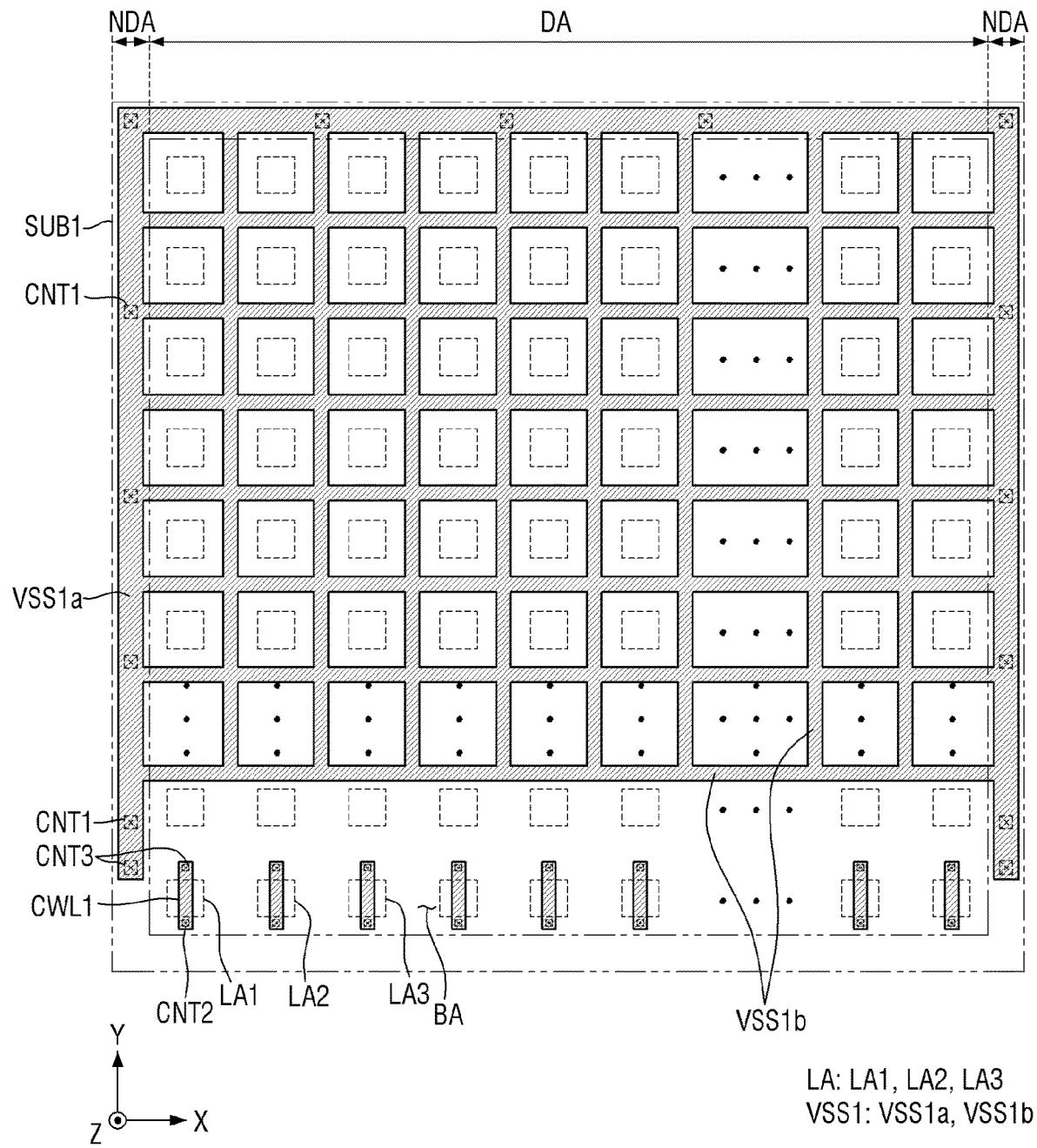
FIG. 14 is a schematic plan view showing a first voltage line and a first connection line in a display device according to still another embodiment.

FIG. 14 is a schematic plan view illustrating a first voltage line and a first connection line in a display device according to still another embodiment.

Referring to FIG. 14, the first voltage line VSS1 may include first and second portions VSS1*a* and VSS1*b*.

The first portion VSS1*a* of the first voltage line VSS1 may be disposed on at least one edge of the first substrate SUB1. The first portion VSS1*a* of the first voltage line VSS1 may be disposed in the non-display area NDA. For example, the first portion VSS1*a* of the first voltage line VSS1 may be disposed on the left edge, the upper edge, and the right edge of the non-display area NDA to surround a part of the display area DA. The width of the first portion VSS1*a* of the first voltage line VSS1 in a plan view may range from about 100 µm to about 200 µm.

The second portion VSS1*b* of the first voltage line VSS1 may have a grid shape in the display area DA. The second portion VSS1*b* of the first voltage line VSS1 may extend in the first direction (e.g., X-axis direction) and the second direction (e.g., Y-axis direction). The second portion VSS1*b* of the first voltage line VSS1 may overlap the light blocking area BA in the thickness direction (e.g., Z-axis direction). The width of the second portion VSS1*b* of the first voltage line VSS1 in a plan view may be smaller than the width of the first portion VSS1*a* of the first voltage line VSS1 in a plan view. The display device 10 may further include the second portion VSS1*b* of the first voltage line VSS1 that does not overlap the emission area LA, thereby improving the visibility of the display device 10 and reducing the resistance of the first voltage line VSS1.

Figure 15:
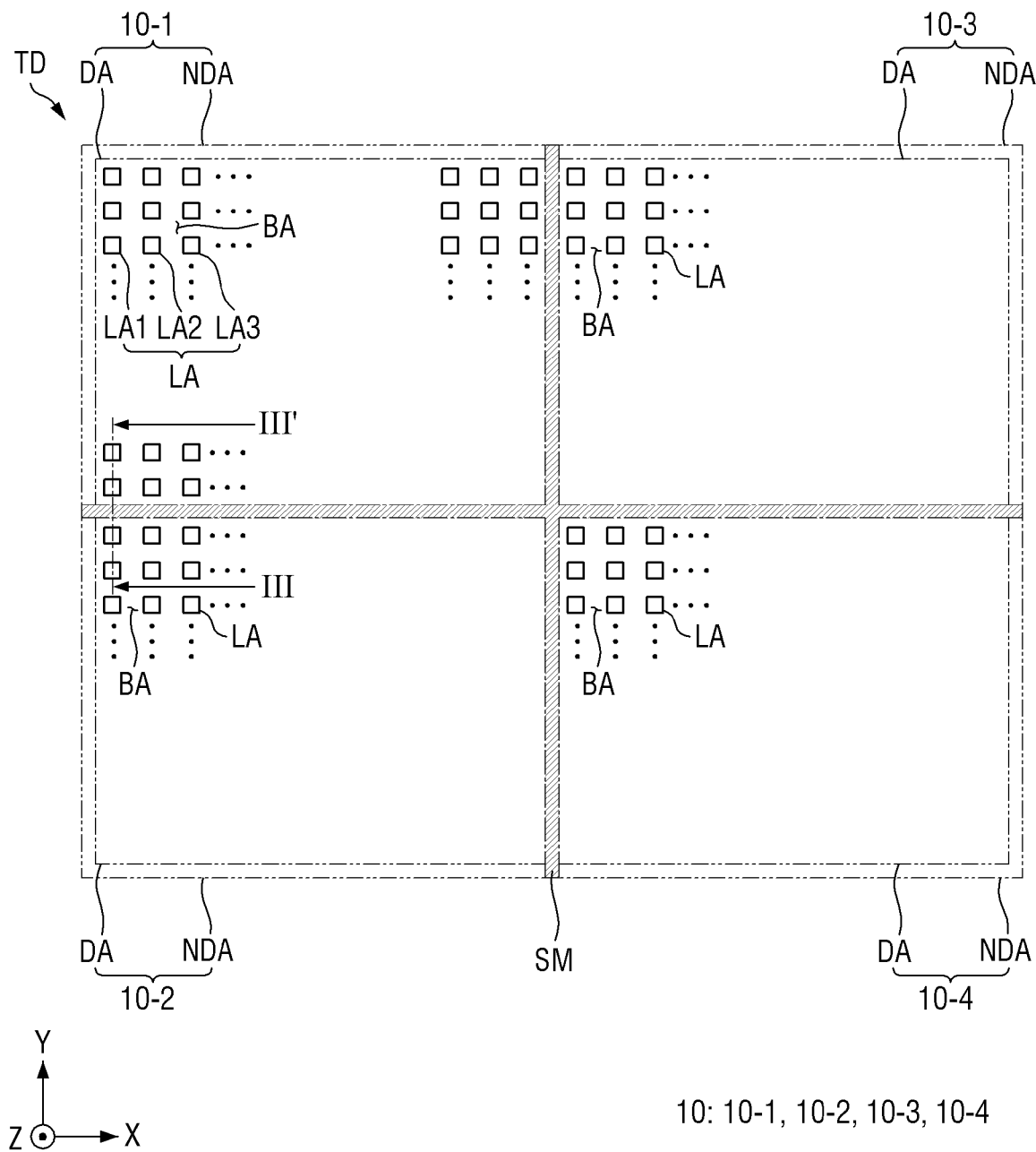
FIG. 15 is a schematic plan view illustrating a coupling or connecting structure of a tiled display device according to an embodiment.
Figure 16:
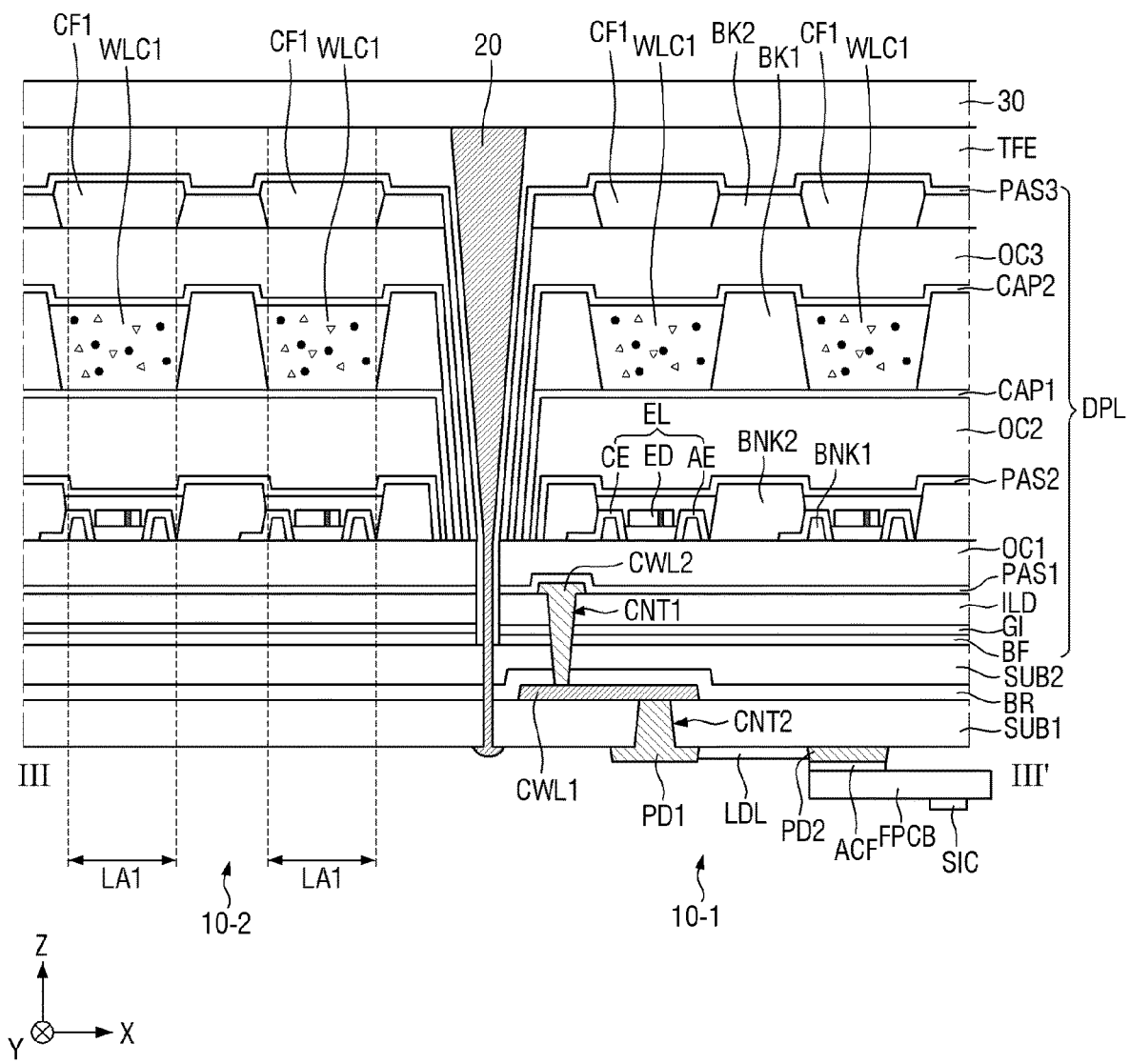
FIG. 16 is a schematic cross-sectional view taken along line of FIG. 15.

FIG. 15 is a schematic plan view illustrating a coupling structure of a tiled display device according to an embodiment. FIG. 16 is a schematic cross-sectional view taken along line of FIG. 15.

Referring to FIGS. 15 and 16, the tiled display device TD may include display devices 10, a bonding member 20, and a cover member 30. The display devices 10 may be arranged in a grid form, but the disclosure is not limited thereto. The display devices 10 may be connected in a first direction (e.g., X-axis direction) or a second direction (e.g., Y-axis direction), and the tiled display device TD may have a particular shape. For example, the display devices 10 may have the same size, but the disclosure is not limited thereto. For another example, the display devices 10 may have different sizes.

The tiled display device TD may include first to fourth display devices 10-1 to 10-4. The number and connection relationship of the display devices 10 are not limited to the embodiment of FIG. 13. The number of the display devices 10 may be determined according to the size of each of the display devices 10 and the tiled display device TD.

The display device 10 may include a display area DA and a non-display area NDA. The display area DA may include pixels to display an image. The non-display area NDA may be disposed around the display area DA to surround the display area DA and may not display an image.

The tiled display device TD may include a coupling area SM disposed between display areas DA. The tiled display device TD may be formed by connecting non-display areas NDA of the adjacent display devices 10. The display devices 10 may be connected to each other through or with the bonding member 20 or an adhesive member disposed in the coupling area SM. The coupling area SM of each of the display devices 10 may not include a pad part and a flexible film attached to the pad part. Accordingly, the distance between the display areas DA of the display devices 10 may be small enough that the coupling area SM between the display devices 10 is not recognized by the user. The reflectance of external light of the display areas DA of the display devices 10 may be substantially equal to that of the coupling area SM between the display devices 10. Accordingly, in the tiled display device TD, the coupling area SM between the display devices 10 may be prevented from being recognized by the user, thereby reducing a sense of disconnection between the display devices 10 and improving a sense of immersion in an image.

The display device 10 may include pixels arranged in rows and columns in the display area DA. Each of the pixels may include an emission area LA defined by a pixel defining layer or bank and may emit light having a predetermined peak wavelength through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may be sequentially arranged repetitively in the first direction (e.g., X-axis direction) in the display area DA. For example, the first emission area LA1 may be larger in size than the second emission area LA2, and the second emission area LA2 may be larger in size than the third emission area LA3. For another example, the first emission area LA1, the second emission area LA2, and the third emission area LA3 may be substantially the same in size.

The display area DA of the display device 10 may include a light blocking area BA surrounding the emission areas LA. The light blocking area BA may prevent the colored lights emitted from the first to third emission areas LA1, LA2, and LA3 from mixing with one another.

The tiled display device TD may bond the side surfaces of the adjacent display devices 10 to each other by using the bonding member 20 disposed between the display devices 10. The bonding member 20 may connect the side surfaces of the first to fourth display devices 10-1 to 10-4 arranged in a grid form to implement the tiled display device TD. The bonding member 20 may bond the side surfaces of the first substrates SUB1, the side surfaces of the barrier layers BR, the side surfaces of the second substrates SUB2, and the side surfaces of the encapsulation layers TFE in the adjacent display devices 10.

For example, the bonding member 20 may be made of an adhesive or a double-sided tape having a relatively thin thickness to minimize the gap between the display devices 10. For another example, the bonding member 20 may be formed of a bonding frame having a relatively thin thickness to minimize the gap between the display devices 10. Accordingly, in the tiled display device TD, it is possible to prevent the user from recognizing the bonding region SM between the display devices 10.

The cover member 30 may be disposed on the top surfaces of the display devices 10 and the bonding member 20 to cover the display devices 10 and the bonding member 20. For example, the cover member 30 may be disposed on the top surface of the encapsulation layer TFE of each of the display devices 10. The cover member 30 may protect the top surface of the tiled display device TD.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a first substrate including:
 a display area including a plurality of emission areas; and
 a non-display area adjacent to the display area;
a first voltage line disposed on the first substrate and supplying a first voltage;
a first connection line overlapping an emission area among the plurality of emission areas and having a same material as the first voltage line;
a second substrate disposed on the first voltage line; and
a thin film transistor layer disposed on the second substrate and comprising:
 a plurality of thin film transistors;
 a second voltage line disposed in the non-display area and electrically connected to the first voltage line through a first contact hole penetrating the second substrate; and
 a second connection line electrically connected to the first connection line through a second contact hole penetrating the second substrate, the second connection line having a same material as the second voltage line.

2. The display device of claim 1, wherein
the first voltage line is disposed on a plurality of edges of the first substrate, and
the second voltage line is disposed on a plurality of edges of the thin film transistor layer.

3. A display device comprising:
a first substrate including:
 a display area; and
 a non-display area adjacent to the display area;
a first voltage line disposed on the first substrate and supplying a first voltage;
a second substrate disposed on the first voltage line; and
a thin film transistor layer disposed on the second substrate and comprising:
 a plurality of thin film transistors; and
 a second voltage line disposed in the non-display area and electrically connected to the first voltage line through a first contact hole penetrating the second substrate, and wherein the first and second voltage lines have a same width in a plan view.

4. The display device of claim 1, wherein a width of the first voltage line in a plan view is greater than a width of the second voltage line in a plan view.

5. The display device of claim 1, wherein the first voltage line is disposed on an edge of the display area and in the non-display area.

6. The display device of claim 1, wherein the first voltage line includes:
a first portion disposed in the non-display area;
a second portion extending from the first portion and traversing the display area; and
a third portion protruding from the second portion disposed in the display area.

7. The display device of claim 1, wherein the first voltage line includes:
a first portion disposed in the non-display area; and
a second portion disposed in the display area, extending in a first direction and a second direction intersecting the first direction, and having a grid shape.

8. The display device of claim 7, wherein
the display area further includes:
 a light blocking area surrounding each of the plurality of emission areas, and
the second portion of the first voltage line overlaps the light blocking area in a thickness direction of the display device.

9. The display device of claim 1, wherein
the first connection line is disposed on an edge of the display area, and
the first voltage line is disposed in the non-display area adjacent to a plurality of edges of the first substrate except for the edge of the display area.

10. The display device of claim 1, wherein the second connection line is electrically connected to the plurality of thin film transistors and supplies a data voltage to the plurality of thin film transistors.

11. The display device of claim 1, further comprising:
a pad part under the first substrate and electrically connected to the first connection line through a third contact hole penetrating the first substrate;
a flexible film under the first substrate and electrically connected to the pad part; and
a data driver on the flexible film to supply a data voltage to the first connection line.

12. The display device of claim 1, further comprising:
a light emitting element layer disposed on the thin film transistor layer and including a plurality of light emitting elements electrically connected between the plurality of thin film transistors and the second voltage line.

13. The display device of claim 12, wherein the thin film transistor layer comprises:
a gate insulating layer disposed on the second substrate;
an interlayer insulating layer disposed on the gate insulating layer; and
a connection electrode disposed on the interlayer insulating layer and electrically connecting the plurality of light emitting elements and the plurality of thin film transistors, wherein
the second connection line and the connection electrode disposed on the interlayer insulating layer include a same material.

14. A tiled display device comprising:
a plurality of display devices including:
a display area including a plurality of emission areas; and
a non-display area adjacent to the display area; and
a bonding member bonding the plurality of display devices,
wherein each of the plurality of display devices comprises:
a first substrate;
a first voltage line disposed on the first substrate and supplying a first voltage;
a first connection line overlapping an emission area among the plurality of emission areas and being supplied with a data voltage;
a second substrate disposed on the first voltage line; and
a thin film transistor layer disposed on the second substrate and comprising:
a plurality of thin film transistors;
a second voltage line disposed in the non-display area and electrically connected to the first voltage line through a first contact hole penetrating the second substrate; and
a second connection line electrically connected to the first connection line through a second contact hole penetrating the second substrate.

15. The tiled display device of claim 14, wherein the first and second voltage lines have a same width in a plan view.

16. The tiled display device of claim 14, wherein a width of the first voltage line in a plan view is greater than a width of the second voltage line in a plan view.

17. The tiled display device of claim 14, wherein the first voltage line includes:
a first portion disposed in the non-display area;
a second portion extending from the first portion and traversing the display area; and
a third portion protruding from the second portion disposed in the display area.

18. The tiled display device of claim 14, wherein the first voltage line includes:
a first portion disposed in the non-display area; and
a second portion disposed in the display area, extending in a first direction and a second direction intersecting the first direction, and having a grid shape.

19. The tiled display device of claim 18, wherein
the display area includes: a light blocking area surrounding each of the plurality of emission areas, and
the second portion of the first voltage line overlaps the light blocking area in a thickness direction of the tiled display device.

* * * * *